(12) United States Patent
Ma et al.

(10) Patent No.: US 7,869,219 B2
(45) Date of Patent: Jan. 11, 2011

(54) FLASH DRIVE WITH SPRING-LOADED RETRACTABLE CONNECTOR

(75) Inventors: Abraham C. Ma, Fremont, CA (US); Jim Chin-Nan Ni, San Jose, CA (US); Nan Nan, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 142 days.

(21) Appl. No.: 12/361,772

(22) Filed: Jan. 29, 2009

(65) Prior Publication Data

US 2009/0177835 A1     Jul. 9, 2009

Related U.S. Application Data

(63) Continuation-in-part of application No. 12/171,194, filed on Jul. 10, 2008, now Pat. No. 7,771,215, and a continuation-in-part of application No. 12/050,748, filed on Mar. 18, 2008, now Pat. No. 7,628,622, and a continuation-in-part of application No. 12/025,706, filed on Feb. 4, 2008, and a continuation-in-part of application No. 11/950,190, filed on Dec. 4, 2007, and a continuation-in-part of application No. 11/845,747, filed on Aug. 27, 2007, and a continuation-in-part of application No. 11/682,261, filed on Mar. 5, 2007, now Pat. No. 7,420,803, and a continuation-in-part of application No. 11/466,759, filed on Aug. 23, 2006, now Pat. No. 7,702,831, and a continuation-in-part of application No. 11/458,987, filed on Jul. 20, 2006, now Pat. No. 7,690,030.

(51) Int. Cl.
*H05K 1/14* (2006.01)
(52) U.S. Cl. ...................... 361/737; 439/131
(58) Field of Classification Search .................. 361/737, 361/752; 439/131
See application file for complete search history.

(56) References Cited

U.S. PATENT DOCUMENTS

| | | | |
|---|---|---|---|
| 4,582,985 A | 4/1986 | Lofberg |
| 4,630,201 A | 12/1986 | White |
| 4,766,293 A | 8/1988 | Boston |
| 4,833,554 A | 5/1989 | Dalziel et al. |
| 4,926,480 A | 5/1990 | Chaum |
| 5,020,105 A | 5/1991 | Rosen et al. |
| 5,180,901 A | 1/1993 | Hiramatsu |
| 5,280,527 A | 1/1994 | Gullman et al. |

(Continued)

FOREIGN PATENT DOCUMENTS

JP          63-163589 A      7/1988

(Continued)

*Primary Examiner*—Phuong K Dinh
(74) *Attorney, Agent, or Firm*—Bever, Hoffman & Harms, LLP; Patrick T. Bever

(57) ABSTRACT

A pen-type computer peripheral device includes an elongated housing containing a PCBA having a plug connector. The PCBA is secured to a positioning member that is actuated by way of a press-push button that is exposed through a slot defined in a wall of the housing. A spring-loaded mechanism includes a spring and a locking mechanism that locks the connector in a retracted position and a deployed position, and the spring biases the connector from the retracted position to the deployed position, or vice versa.

13 Claims, 40 Drawing Sheets

U.S. PATENT DOCUMENTS

| | | | |
|---|---|---|---|
| 5,404,485 | A | 4/1995 | Ban |
| 5,430,859 | A | 7/1995 | Norman et al. |
| 5,479,638 | A | 12/1995 | Assar et al. |
| 5,623,552 | A | 4/1997 | Lane |
| 5,797,771 | A | 8/1998 | Garside |
| 5,835,760 | A | 11/1998 | Harmer |
| 5,899,773 | A | 5/1999 | Cheng |
| 5,907,856 | A | 5/1999 | Estakhri et al. |
| 5,959,541 | A | 9/1999 | DiMaria et al. |
| 5,984,731 | A | 11/1999 | Laity |
| 6,000,006 | A | 12/1999 | Bruce et al. |
| 6,012,636 | A | 1/2000 | Smith |
| 6,044,428 | A | 3/2000 | Rayabhari |
| 6,069,920 | A | 5/2000 | Schulz et al. |
| 6,069,970 | A | 5/2000 | Salatino et al. |
| 6,081,858 | A | 6/2000 | Abudayyeh et al. |
| 6,125,192 | A | 9/2000 | Bjorn et al. |
| 6,132,243 | A | 10/2000 | Hirata et al. |
| 6,148,354 | A | 11/2000 | Ban et al. |
| 6,159,039 | A | 12/2000 | Wu |
| 6,193,152 | B1 | 2/2001 | Fernando et al. |
| 6,202,138 | B1 | 3/2001 | Estakhri et al. |
| 6,230,233 | B1 | 5/2001 | Lofgren et al. |
| 6,275,894 | B1 | 8/2001 | Kuo et al. |
| 6,279,955 | B1 | 8/2001 | Fisher |
| 6,292,863 | B1 | 9/2001 | Terasaki et al. |
| 6,321,478 | B1 | 11/2001 | Klebes |
| 6,334,793 | B1 | 1/2002 | Amoni et al. |
| 6,438,638 | B1 | 8/2002 | Jones et al. |
| 6,456,500 | B1 | 9/2002 | Chen |
| 6,480,390 | B2 | 11/2002 | Matsumiya et al. |
| 6,547,130 | B1 | 4/2003 | Shen |
| 6,554,648 | B2 | 4/2003 | Shi et al. |
| 6,567,273 | B1 | 5/2003 | Liu et al. |
| 6,615,404 | B1 | 9/2003 | Garfunkel et al. |
| 6,618,243 | B1 | 9/2003 | Tirosh |
| 6,636,929 | B1 | 10/2003 | Frantz et al. |
| 6,718,407 | B2 | 4/2004 | Martwick |
| 6,737,591 | B1 | 5/2004 | Lapstun et al. |
| 6,743,030 | B2 | 6/2004 | Lin et al. |
| 6,763,410 | B2 | 7/2004 | Yu |
| D494,969 | S | 8/2004 | Lin |
| 6,778,401 | B1 | 8/2004 | Yu et al. |
| 6,792,487 | B2 | 9/2004 | Kao |
| 6,808,400 | B2 * | 10/2004 | Tu ............................ 439/131 |
| 6,854,984 | B1 | 2/2005 | Lee et al. |
| 6,880,024 | B2 | 4/2005 | Chen et al. |
| 7,004,780 | B1 | 2/2006 | Wang |
| 7,021,971 | B2 | 4/2006 | Chou et al. |
| 7,044,802 | B2 | 5/2006 | Chiou et al. |
| 7,069,370 | B2 | 6/2006 | Sukegawa et al. |
| 7,074,052 | B1 | 7/2006 | Ni et al. |
| 7,090,541 | B1 | 8/2006 | Ho |
| 7,097,472 | B2 | 8/2006 | Parker |
| 7,103,684 | B2 | 9/2006 | Chen et al. |
| 7,103,765 | B2 | 9/2006 | Chen |
| 7,104,848 | B1 | 9/2006 | Chou et al. |
| 7,125,287 | B1 | 10/2006 | Chou et al. |
| 7,155,545 | B1 | 12/2006 | Wang |
| 7,172,460 | B2 | 2/2007 | Zhao et al. |
| 7,182,646 | B1 | 2/2007 | Chou et al. |
| 7,214,075 | B2 | 5/2007 | He et al. |
| 7,249,978 | B1 | 7/2007 | Ni |
| 7,257,714 | B1 | 8/2007 | Shen |
| 7,259,967 | B2 | 8/2007 | Ni |
| 7,264,992 | B2 | 9/2007 | Hsueh et al. |
| 7,359,208 | B2 | 4/2008 | Ni |
| 7,361,059 | B2 | 4/2008 | Harkabi et al. |
| 7,632,113 | B2 * | 12/2009 | Finn ............................ 439/131 |
| 7,704,084 | B1 * | 4/2010 | Cheng ........................ 439/131 |
| 7,778,037 | B2 * | 8/2010 | Huang ........................ 361/752 |
| 2001/0043174 | A1 | 11/2001 | Jacobsen et al. |
| 2002/0036922 | A1 | 3/2002 | Roohparvar |
| 2002/0166023 | A1 | 11/2002 | Nolan et al. |
| 2003/0046510 | A1 | 3/2003 | North |
| 2003/0100203 | A1 | 5/2003 | Yen |
| 2003/0163656 | A1 | 8/2003 | Ganton |
| 2003/0177300 | A1 | 9/2003 | Lee et al. |
| 2003/0182528 | A1 | 9/2003 | Ajiro |
| 2004/0034765 | A1 | 2/2004 | James |
| 2004/0148482 | A1 | 7/2004 | Grundy et al. |
| 2004/0153595 | A1 | 8/2004 | Sukegawa et al. |
| 2004/0255054 | A1 | 12/2004 | Pua et al. |
| 2005/0009388 | A1 | 1/2005 | Chao |
| 2005/0085133 | A1 | 4/2005 | Wang et al. |
| 2005/0102444 | A1 | 5/2005 | Cruz |
| 2005/0114587 | A1 | 5/2005 | Chou et al. |
| 2005/0120146 | A1 | 6/2005 | Chen et al. |
| 2005/0160213 | A1 | 7/2005 | Chen |
| 2005/0182858 | A1 | 8/2005 | Lo et al. |
| 2005/0193161 | A1 | 9/2005 | Lee et al. |
| 2005/0193162 | A1 | 9/2005 | Chou et al. |
| 2005/0216624 | A1 | 9/2005 | Deng et al. |
| 2005/0246243 | A1 | 11/2005 | Adams et al. |
| 2005/0268082 | A1 | 12/2005 | Poisner |
| 2005/0271458 | A1 | 12/2005 | Kui |
| 2006/0065743 | A1 | 3/2006 | Fruhauf |
| 2006/0075174 | A1 | 4/2006 | Vuong |
| 2006/0106962 | A1 | 5/2006 | Woodbridge et al. |
| 2006/0161725 | A1 | 7/2006 | Lee et al. |
| 2006/0184709 | A1 | 8/2006 | Sukegawa et al. |
| 2006/0206702 | A1 | 9/2006 | Fausak |
| 2006/0234533 | A1 | 10/2006 | Lei et al. |
| 2006/0242395 | A1 | 10/2006 | Fausak |
| 2007/0079043 | A1 | 4/2007 | Yu et al. |
| 2007/0094489 | A1 | 4/2007 | Ota et al. |
| 2007/0113067 | A1 | 5/2007 | Oh et al. |
| 2007/0113267 | A1 | 5/2007 | Iwanski et al. |
| 2007/0130436 | A1 | 6/2007 | Shen |
| 2009/0124104 | A1 | 5/2009 | Zhu et al. |
| 2010/0124831 | A1 | 5/2010 | Chou et al. |

FOREIGN PATENT DOCUMENTS

| | | | |
|---|---|---|---|
| JP | 02-118790 A | 5/1990 | |
| JP | 11-039483 | 2/1999 | |

* cited by examiner

Data structure of PLTPPUI in Reserved Area of MLC Flash Memory 420

Old physical block (PBK#1000) for storing PLTPPUI0 422

| | | | | 427 | | 442 | 446 |
|---|---|---|---|---|---|---|---|
| 1st Write (P0) 424a | Entry 0 | Entry 1 | ** | FF | Special Logical Address for PLTPPUI0 | | 1 |
| 2nd Write (P1) 424b | Entry 0 | Entry 1 | | | | | |
| ** | | | | | | | |
| nth Write (Pn) 424n | Entry 0 | Entry 1 | ** | | | | |

425 }  426 }

New physical block (PBK#1012) for storing PLTPPUI0 432

| | | | | | |
|---|---|---|---|---|---|
| (n+1)th Write (P0) 434 | Entry 0 | Entry 1 | ** | FF | Special Logical Address for PLTPPUI0 | 2 |
| | | | | | |
| | | | | | |
| | | | | | |

*FIG. 4C*

Data Structure of the PLTPPUl Tracking Table 440

| | Physical Block Number 444 | Tracking No. (TN) 446 | Highest Page 448 |
|---|---|---|---|
| Special Logical Address for PLTPPUl0 | 1012 | 0 | 0 |
| Special Logical Address for PLTPPUl1 | 1018 | 5 | 1 |
| ⋮ | | | |
| Special Logical Address for PLTPPUlN | 1005 | 4 | 0 |

442 brackets the middle rows.

FIG. 4D

Data Structure of the WL/BB Tracking Table 450

| | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ | | | |
| Special Logical Address for WL/BBn | 1021 | 3 | 7 |

452 brackets the middle rows.

FIG. 4E

Data Structure of the WL/BB Tracking Table in Reserved Area of Flash Memory 460

| | | | | 467 | 452 456 | |
|---|---|---|---|---|---|---|
| 1st White (P0) | BK0 (reserved) | BK1 WL | | | BK7 BB FFFF FFEE | F  Special Logical  1<br>F  Address for<br>   WL/BB1 |
| 2nd White (P1) | | BK1 WL old | BK3 WL new | | | |
| 3rd White (P2) | | BK1 WL old | BK3 WL old | BK5 WL new | | |
| ● | | | | | | |
| ● | | | | | | |
| nth White (Pn) | | | | | BK 1000 WL new | |

| | | | | | |
|---|---|---|---|---|---|
| 1st White (P0) | BK 1000 WL new | | BK 1003 BB | | F  Special Logical  1<br>F  Address for WL/BB2 |
| 2nd White (P1) | BK 1000 WL old | | | BK 1021 WL new | |
| ● | | | | | |
| ● | | | | | |
| nth White (Pn) | | | | | |

*FIG. 4F*

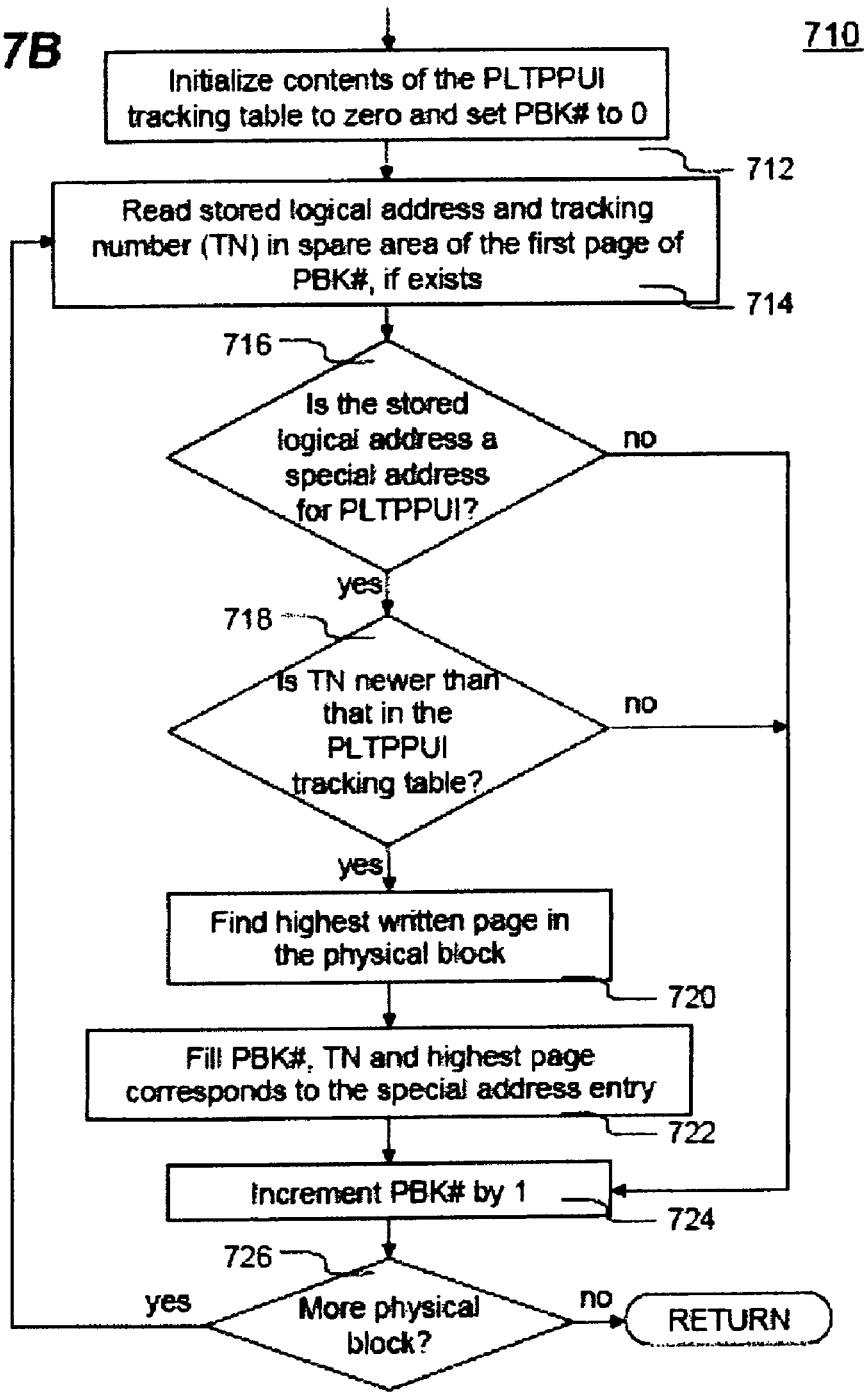

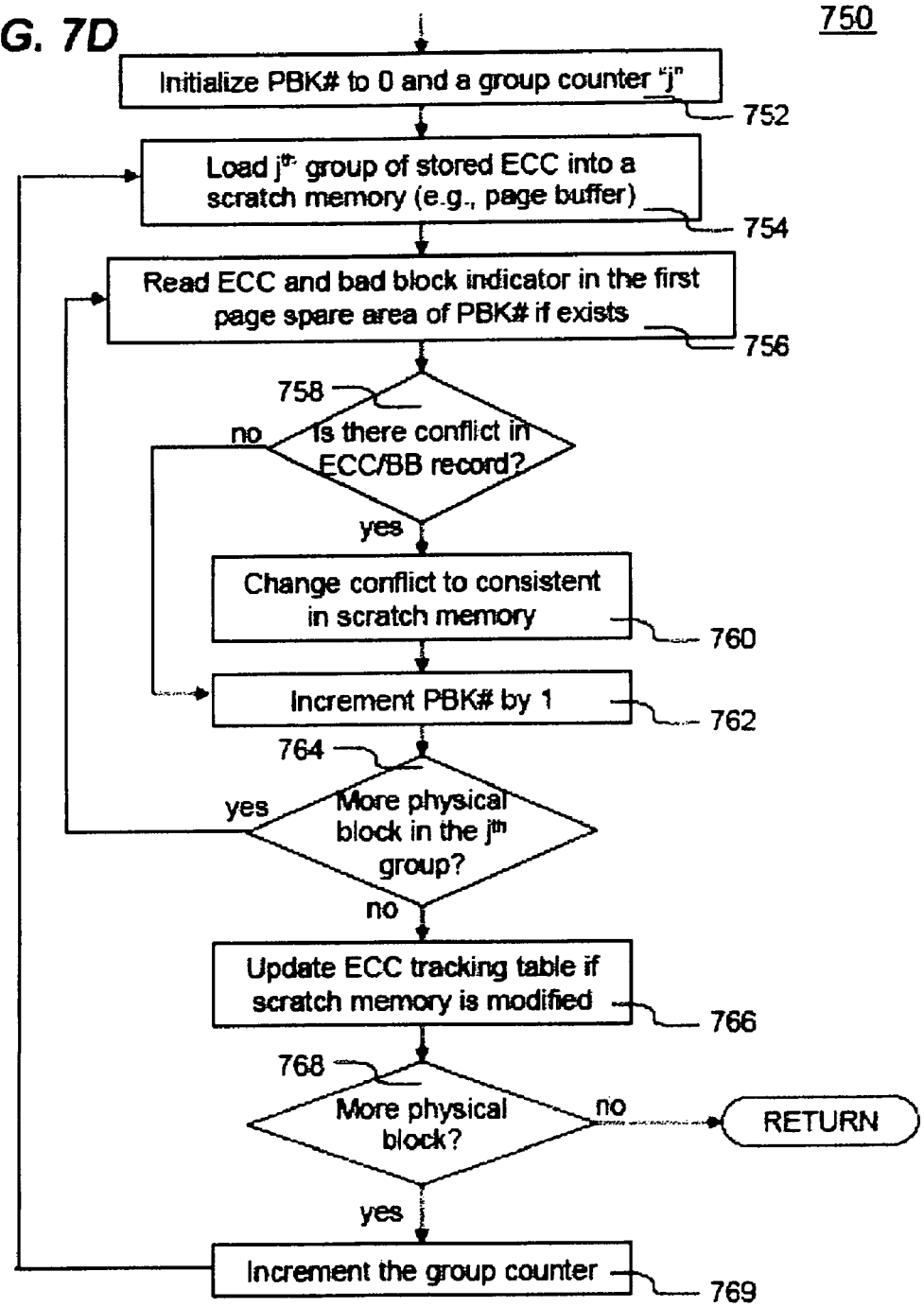

FLASH DRIVE WITH SPRING-LOADED RETRACTABLE CONNECTOR

RELATED APPLICATIONS

This application is a continuation-in-part (CIP) of co-pending U.S. patent application for "Methods and Systems of Managing Memory Addresses in a Large Capacity Multi-Level Cell (MLC) based flash memory device", Ser. No. 12/025,706, filed Feb. 4, 2008.

This application is also a (CIP) of co-pending U.S. patent application for "Press/Push USB Flash Drive with Deploying and Retracting Functionalities with Elasticity Material and Fingerprint Verification Capability", Ser. No. 11/845,747, filed Aug. 27, 2007.

This application is also a CIP of U.S. patent application for "Multi-Level Cell (MLC) Slide Flash Memory Device", Ser. No. 12/050,748, filed Mar. 18, 2008 now U.S. Pat. No.7,628,622.

This application is a CIP of U.S. patent application for "MLC COB USB Flash Memory Device with Sliding Plug Connector", Ser. No. 12/171,194, filed Jul. 10, 2008 now U.S. Pat. No. 7,771,215.

This application is also a CIP of U.S. patent application for "Universal Serial Bus Flash Drive with Deploying and Retracting Functionalities", Ser. No. 11/682,261 filed Mar. 5, 2007 now U.S. Pat. No. 7,420,803.

This application is also a CIP of co-pending U.S. patent application for "Pen-like Universal Serial Bus (USB) Flash Drive with Deploying and Retracting Functionalities", Ser. No. 11/950,190, filed Dec. 4, 2007.

This application is also a CIP of U.S. patent application for "Flash Memory Controller For Electronic Data Flash Card", Ser. No. 11/466,759, filed Aug. 23, 2006 ; now U.S. Pat. No. 7,702,831 which is a continuation-in-part of U.S. Patent application for "ELECTRONIC DATA FLASH CARD WITH FINGERPRINT VERIFICATION CAPABILITY", U.S. application Ser. No. 11/458,987, filed Jul. 20, 2006 now U.S. Pat. No. 7,690,030.

This application relates to U.S. Pat. No. 7,004,780, filed on May 13, 2004, and entitled "PORTABLE COMPUTER PERIPHERAL APPARATUS WITH RETRACTABLE PLUG CONNECTOR".

BACKGROUND OF THE INVENTION

1. Field of the Invention

The invention relates to flash memory devices, more particularly to systems and methods of managing memory addresses in a large capacity multi-level cell (MLC) based flash memory device.

2. Description of the Related Art

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity. As such, a problem arises when mobile systems that are designed for one type of flash memory are constructed using another, incompatible type of flash memory.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition, flash memory is replacing floppy disks because flash memory provides higher storage capacity and faster access speeds than floppy drives.

In addition to the limitations introduced by the USB standard, there are inherent limitations with flash memory. First, flash memory sectors that have already been programmed must be erased before being reprogrammed. Also, flash memory sectors have a limited life span; i.e., they can be erased only a limited number of times before failure. Accordingly, flash memory access is slow due to the erase-before-write nature and ongoing erasing will damage the flash memory sectors over time.

To address the speed problems with USB-standard flash memory, hardware and firmware utilize existing small computer systems interface (SCSI) protocols so that flash memory can function as mass-storage devices similarly to magnetic hard disks. SCSI protocols have been used in USB-standard mass-storage devices long before flash memory devices have been widely adopted as storage media. Accordingly, the USB standard has incorporated traditional SCSI protocols to manage flash memory.

As the demands for larger capacity storage increase, the flash memory device needs to keep up. Instead of using single-level cell flash memory, which stores one-bit of information per cell, multi-level cell (MLC) flash memory, or hybrid flash memory, which is assembled partially SLC and partially MLC, is used. The MLC flash memory allows at least two bits per cell. However, there are a number of problems associated with the MLC flash memory. First, the MLC flash memory has a low reliability. Secondly, the MLC flash memory data programming rules require writing to an ascending page in the same block or writing to a blank new page if there are data existed in the original page. Finally, a larger capacity requires a large logical-to-physical address look up table. In the prior art approach, the size look up table is in direct portion with the capacity of the flash memory. This creates a huge problem not only to the cost, but also to the physical size of the flash memory device. Furthermore, the traditional usage of the flash memory devices is generally in a very clean and relatively mild environment, thus the packaging design such as enclosure of the flash memory device is not suitable for hostile environment such as military and heavy industrial applications.

Modern portable computer peripheral devices for storing confidential data take many mechanical forms. In most cases, such peripheral devices have been reduced to "pocket size", meaning that they can literally be carried in a user's pocket in the same manner as a wallet or set of keys. One example of particular interest is a pen-type flash device having a USB connector plug that can be connected to a USB port of a standard computer. The USB plug connector is protected by a removable cover when not in use. A problem with convention pen-type peripheral devices is that the removable cover can become inadvertently lost while the device is in use, thereby leaving the USB plug connector exposed to damage or contamination.

An alternative to conventional pen-type peripheral devices is a "press-push" memory device, which provides a connector that retracts into a housing of the memory device for protection when not in use. A device with a retractable connector generally has a button feature on the outside of its housing that allows a user to manually slide the connector between a retracted position and an extended (deployed) position. In the extended position, the connector extends through an opening in the housing so that it may be plugged into a receptacle. In the retracted position, the connector is contained within the housing and is protected by the housing, thereby obviating the need for a separate cap that can be lost.

Although "press-push" memory devices avoid the problems of conventional pen-type peripheral devices, e.g., by avoiding the need for a separate cap, the molded plastic used to produce these devices can become worn over a relatively short amount of time, leading to undesirable resistance or jamming that prevents the desired retraction of the connector when not in use.

Therefore, it would be desirable to have improved methods and systems of managing memory addresses in a large capacity multi-level cell (MLC) flash memory device. What is also needed is a retractable portable computer peripheral apparatus for housing a large capacity multi-level cell (MLC) flash memory device that overcomes the problems associated with conventional press-push memory devices.

SUMMARY OF THE INVENTION

Methods and systems of managing memory addresses in a large capacity multi-level cell (MLC) based flash memory device are disclosed. According to one aspect of the present invention, a MLC based flash memory device comprises a card body with a processing unit, an input/output (I/O) circuit and at least one MLC flash memory chip mounted thereon. The card body may comprise a print circuit board (PCB). The I/O circuits generally are coupled to the processing unit in form of an integrated circuit. The processing unit manages data transfers between a host computing device (e.g., personal computer, consumer electronic device) and the at least one flash memory chip. The MLC based flash memory chip is configured to provide data storage for the host.

The present invention is particularly directed to a retractable portable computer peripheral device (apparatus) for safely transporting a MLC based flash memory chip (device) in which a plug connector (e.g., a USB plug connector) is electrically connected to the MLC based flash memory device and is manually retracted inside or deployed through a front end (second) opening of an elongated housing by way of a spring-loaded mechanism that biases the plug connector either into or out of the housing. The spring-loaded mechanism includes an actuating button that protrudes through an actuator (first) opening defined in the housing, and a locking structure that secures the plug connector in the retracted and deployed positions. A resilient member, preferably a linear spring, is coupled to the plug connector and either to a front portion or a rear portion of the housing, depending on whether the spring is used to deploy or retract the plug connector. For example, in a spring-loaded retraction embodiment, a linear spring is connected between the plug connector and the rear housing portion, whereby the plug connector is deployed from the housing by manually pressing and sliding the actuating button to stretch a linear spring until the lock mechanism is engaged, and subsequent retraction of the connector into the housing enclosure is performed by releasing the spring-loaded mechanism (e.g., by re-pressing the actuating button), whereby the mechanical energy stored in the linear spring biases the connector back inside the housing. Conversely, in a spring-loaded extension embodiment, the linear spring is connected between the plug connector and the front housing portion such that the spring is stretched in the retracted position, and subsequent release of the spring-loaded mechanism causes the linear spring to bias the connector out of the housing into its deployed position. By utilizing linear springs to retract or deploy the plug connector in this manner, the present invention provides a computer peripheral device having a desirable spring-loaded deploying/retracting feature that protects the plug connector without the need for a separate cap, and also serves to reduce wear that can lead to jamming by maintaining the plug connector in a proper orientation relative to the housing during the deploying and retracting operation.

In according with several disclosed specific embodiments, the spring-loaded mechanism includes an assembly formed by a sliding rack (positioning member) and a printed circuit board assembly (PCBA), where the plug connector is fixed connected to a front end of the PCBA, the MLC based flash memory chip is mounted on the PCBA, and the actuating button is integrally formed on or attached to the sliding rack. The deployed/retracted position of the assembly inside an elongate housing is controlled by a locking mechanism controlled by the actuating button and a corresponding locking member disposed on the housing. In one set of specific embodiments, the button extends through a slot defined in a side wall of the housing such that, when a user manually presses and slides the press-push button along the slot, the user is able to move the plug connector between a retracted position, in which the plug connector is positioned inside of the housing, and a deployed position in which the plug connector extends through the opening and is exposed outside of the housing. In another set of embodiments, the button extends through a rear opening defined in the rear portion of the housing such that the user manually presses or pulls the button to move the plug connector between the retracted and deployed positions. In both of these types of apparatus, a spring is connected between the sliding rack and the housing to bias the assembly either into the deployed position or into the retracted position.

In accordance with some of the disclosed specific embodiments, the sliding rack includes a base portion and a pair of side walls fixedly attached to the base portion, and two or more linear springs are disposed on opposing sides of the positioning member such that the linear springs are parallel to and in contact with the side walls. In one or more specific embodiments, the linear springs are slidably received inside elongated side grooves provided on the side walls. With this arrangement, the linear springs are maintained in a planar region defined by the side grooves and/or a spaced between the side walls of the slide rack and opposing side walls of the housing, thereby providing reliable and long-lasting spring-loaded functionality while requiring a minimum of space. Further, by disposing the linear springs on opposite sides of the slide rack, the slide rack is biased into a central position within the housing, thereby reducing wear caused by repeated retraction/deployment operations.

In accordance with another aspect of the present invention employed in some of the embodiments disclosed herein, a flexible wall is disposed on the base portion of the sliding rack, and a press-push-type actuating button is integrally disposed on the flexible wall such that the actuating button extends through a slot defined in the housing wall. The flexible wall is supported by the sliding rack in the housing such that when the press-push button is manually pressed into the housing, the slide rails (side walls) of the sliding rack contact and slide along an inside surface of the housing wall, thus allowing the flexible wall to bend or otherwise resiliently deflect into the housing. When the press-push button is subsequently released, the flexible wall resiliently returns the press-push button to its original (raised) position. This resilient bending is utilized to engage and disengage the locking structure (e.g., a locking tab) formed on the flexible wall from corresponding locking structures (e.g., lock grooves) formed on the housing wall.

BRIEF DESCRIPTION OF THE DRAWING

Other features and advantages of the present invention will become apparent in the following detailed description of the preferred embodiment with reference to the accompanying drawings, of which:

FIGS. 4A-4F collectively show exemplary data structures used for managing memory addresses of the flash memory of FIG. 2A in accordance with one embodiment of the present invention;

FIGS. 7A-7E collectively are a flowchart illustrating an exemplary process of initialization of a large capacity flash memory device in accordance with one embodiment of the present invention;

FIGS. 14-1 and 14-2 are partial perspective views depicting the peripheral device of FIG. 12(A) during operation;

DETAILED DESCRIPTION OF THE PREFERRED EMBODIMENT

The present invention relates to an improvement in flash memory devices such as USB flash drives. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
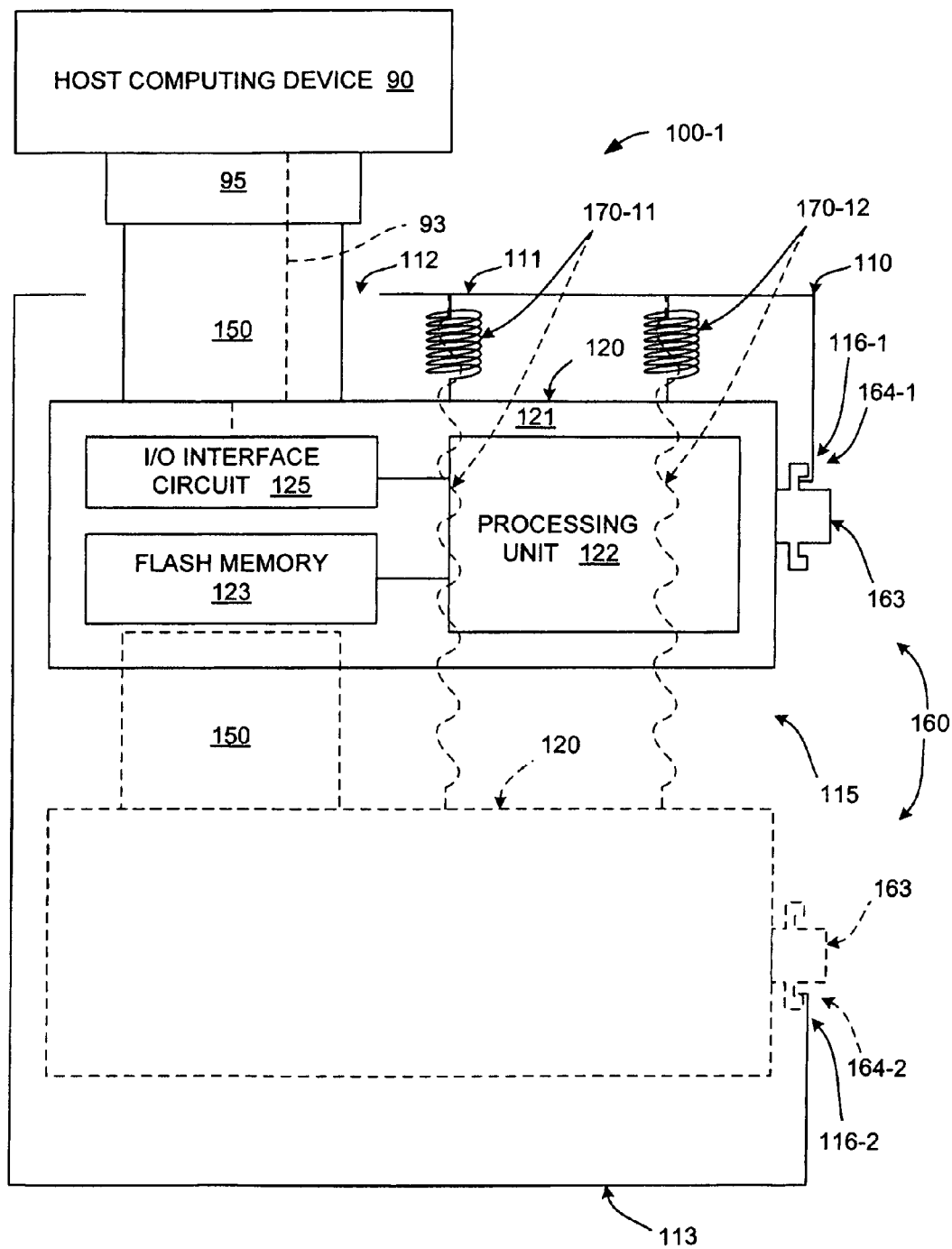
FIGS. 1(A) and 1(B) are simplified diagrams showing electronic apparatus representing simplified embodiments of the present invention.

FIG. 1(A) is a block diagram illustrating an electronic environment in which the present invention may be deployed in an exemplary electronic flash memory device. In particular, FIG. 1(A) is a simplified diagram showing a portable computer peripheral apparatus (e.g., a flash drive device) 100-1 according to a generalized embodiment of the present invention. Apparatus 100-1 is adapted to be accessed by an external computer 90, and is shown to include a printed circuit board assembly (PCBA) 120 including a card body 121, a processing unit 122, a memory device 123, and an input/output interface circuit 125.

Card body 121 is configured for providing electrical and mechanical connection for the processing unit 122, the flash memory module 123, the I/O interface circuit 125, and all of the optional components. Card body 121 may comprise a printed circuit board (PCB) or an equivalent substrate such that all of the components as integrated circuits may be mounted thereon. The substrate may be manufactured using surface mount technology (SMT) or chip on board (COB) technology.

Processing unit 122 and the I/O interface circuit 125 are collectively configured to provide various control functions (e.g., data read, write and erase transactions) of the flash memory module 123. Processing unit 122 may also be a standalone microprocessor or microcontroller, for example, an 8051, 8052, or 80286 Intel® microprocessor, or ARM®, MIPS® or other equivalent digital signal processor. Processing unit 122 and the I/O interface circuit 125 may be made in a single integrated circuit, for application specific integrated circuit (ASIC).

The at least one flash memory module 123 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof. Flash memory module 123 stores, in a known manner therein, one or more data files and an optional reference password. In one embodiment, only authorized users can access the stored data files. The data file can be a picture file, a text file or any other file.

Input/output interface circuit 125 is mounted on the card body 121, and can be activated so as to establish communication with the host computing device 90 by way of a socket 95 via an interface bus 93 that is established when a connector 150 attached to card body 121 is coupled with socket 95. Input/output interface circuit 125 may include circuits and control logic associated with a Universal Serial Bus (USB) interface structure that is connectable to an associated socket connected to or mounted on the host computing device 90.

Processing unit 122 is controlled by a software program module (e.g., a firmware (FW)), which may be stored partially in a ROM (not shown) such that processing unit 122 is operable selectively in: (1) a data programming or write mode, where processing unit 122 activates input/output interface circuit 125 to receive data from the host computing device 90 under the control of the host computing device 90, and store the data in the flash memory module 123; (2) a data retrieving or read mode, where the processing unit 122 activates the input/output interface circuit 125 to transmit data stored in the flash memory module 123 to the host computing device 90; or (3) a data resetting or erasing mode, where data in stale data blocks are erased or reset from the flash memory module 123. In operation, host computing device 90 sends write and read data transfer requests to the first flash memory device 100-1 via the interface bus 93, then input/output interface circuit 125 to the processing unit 122, which in turn utilizes a flash memory controller (not shown or embedded in the processing unit) to read from or write to the associated at least one flash memory module 123. In one embodiment, for further security protection, the processing unit 122 automatically initiates an operation of the data resetting mode upon detecting a predefined time period has elapsed since the last authorized access of the data stored in flash memory module 123.

Figure 2A:
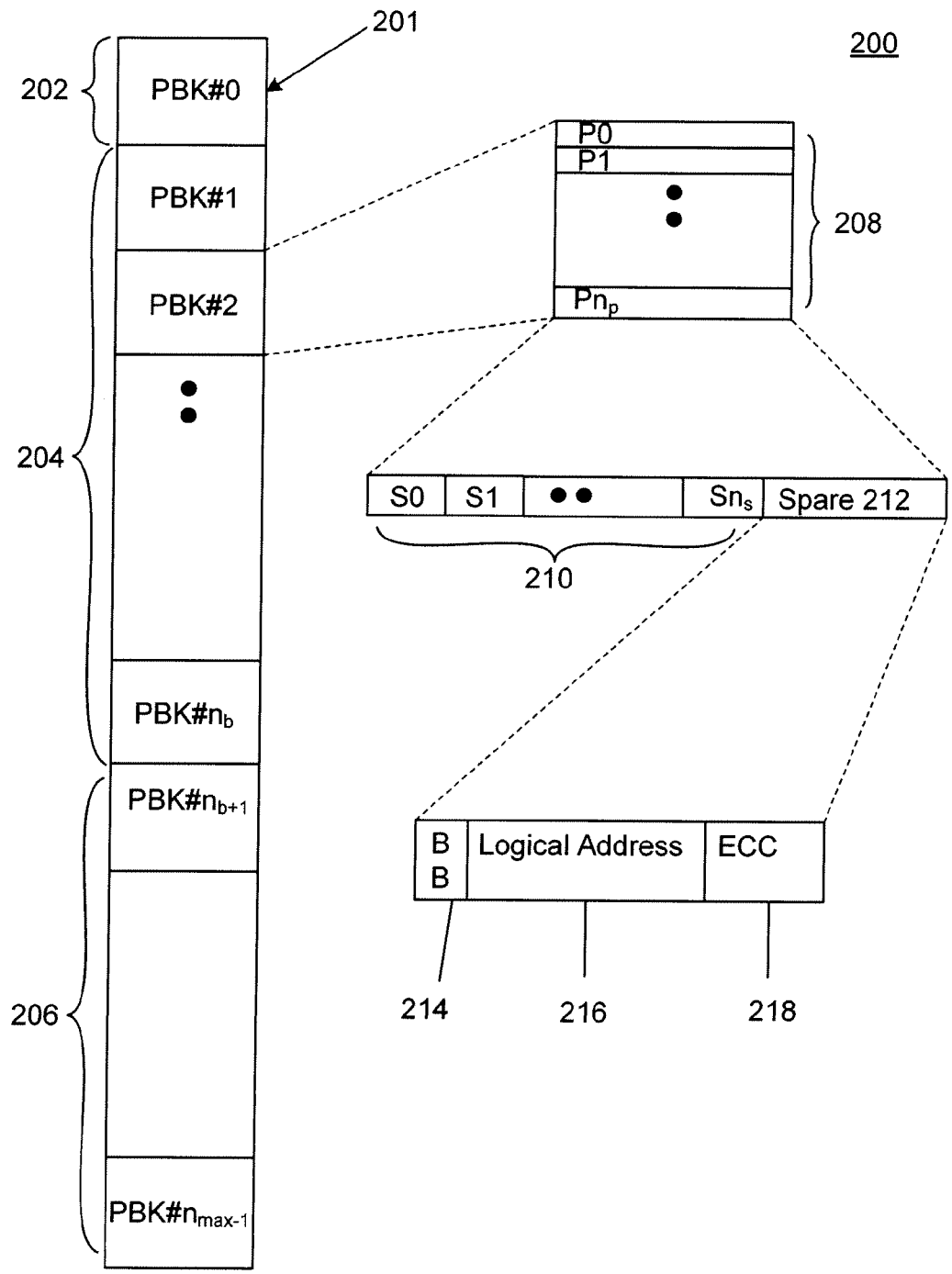
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory module 123 of FIG. 1(A)) in accordance with one embodiment of the present invention. The flash memory module 201 is divided into a plurality of physical blocks e.g., PBK#0, PBK#1, PBK#2, . . . ). In general, there are three categories of physical blocks: 1) the first block 202 (i.e., PBK#0); 2) normal usage data blocks 204 (i.e., PBK#1, PBK#2, . . . , PBK#$n_b$); and 3) reserved blocks 206 (i.e., PBK#$n_{b+1}$, . . . , PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Figure 4A:
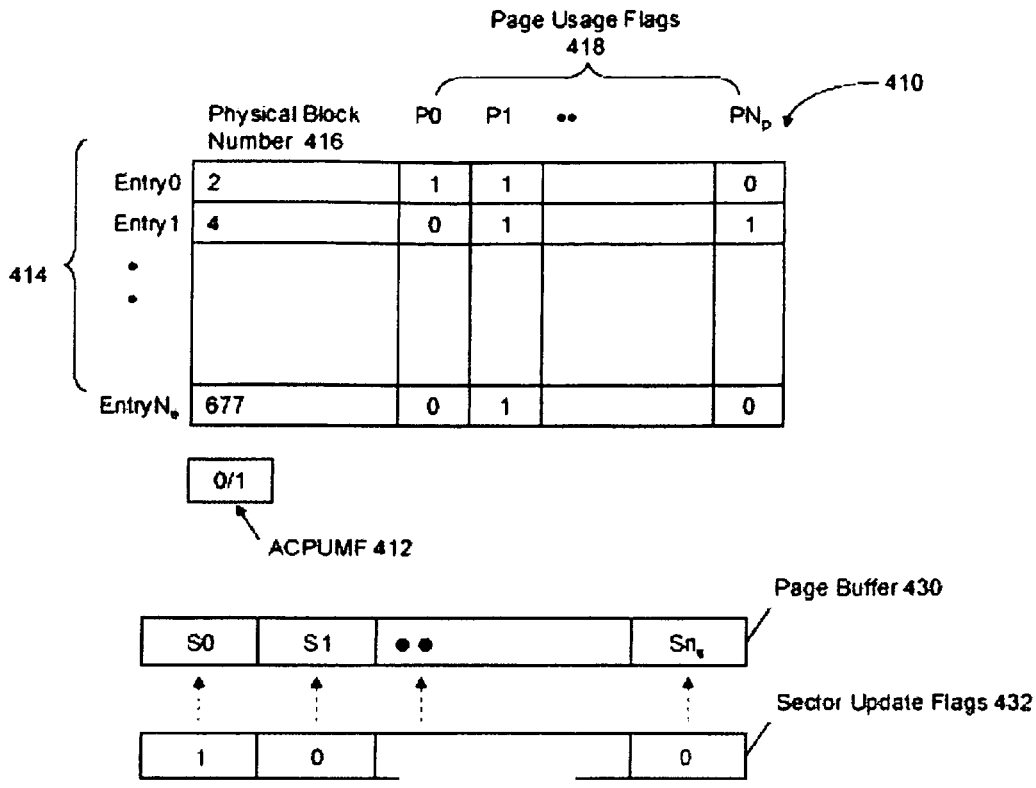
Figure 4B:
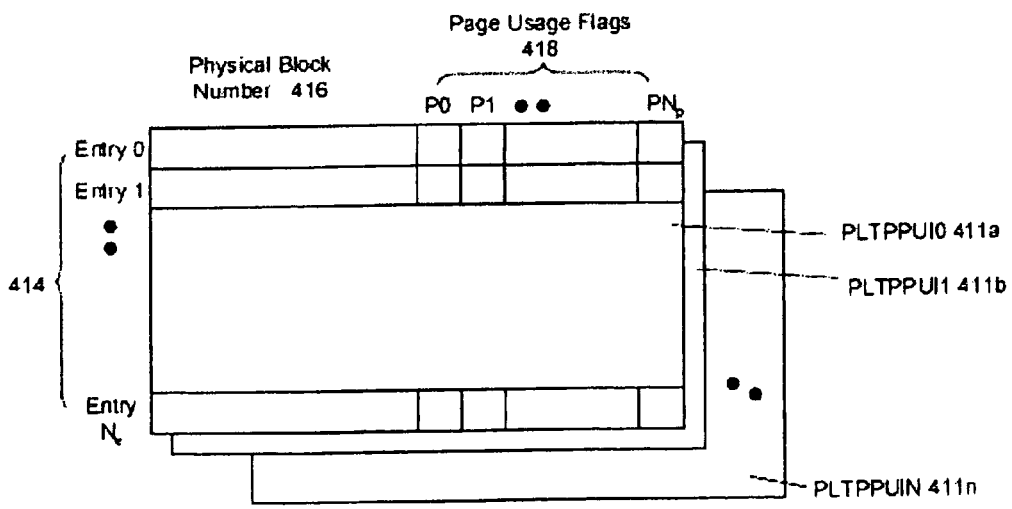

Each block is further divided into a plurality of pages 208 (e.g., P0, P1, . . . , Pn$_p$). Each of the pages 208 includes a data area 210 and a spare area 212. The data area is partitioned into a plurality of sectors (e.g., S0, S1, . . . , Sn$_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 90 transmits a data transaction request (e.g., data read or write) along with a logical sector address (LSA) to the flash memory device. The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048- byte data plus 64-byte spare) and 128 pages per block, it would require more than 2 MB bytes of SRAM to hold the entire address look up table.

Figure 2B:
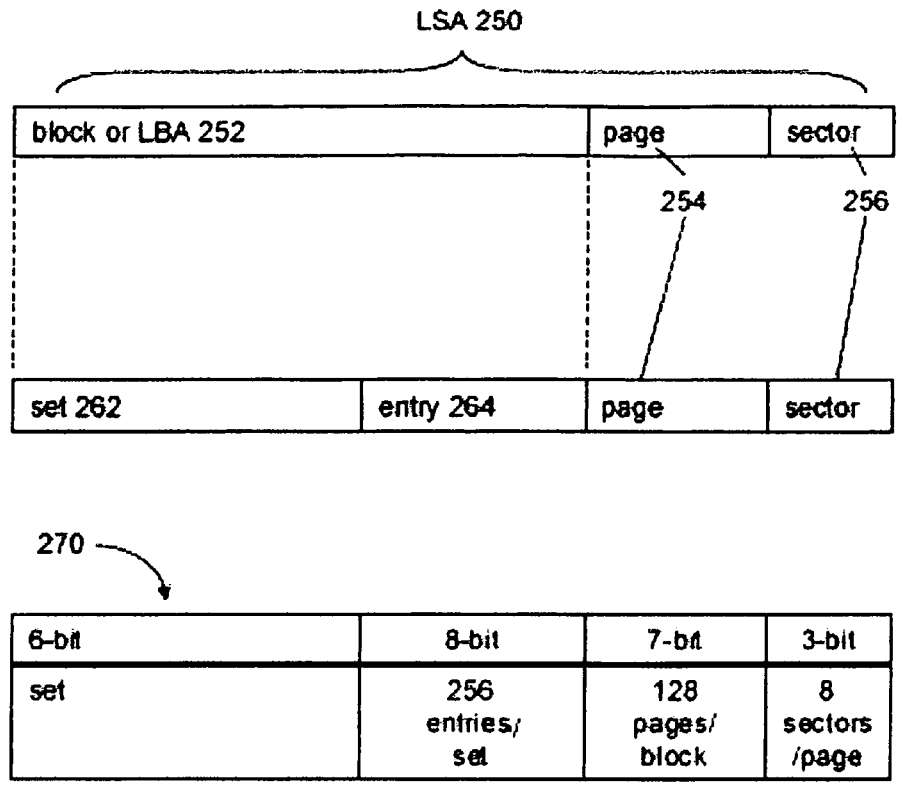
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
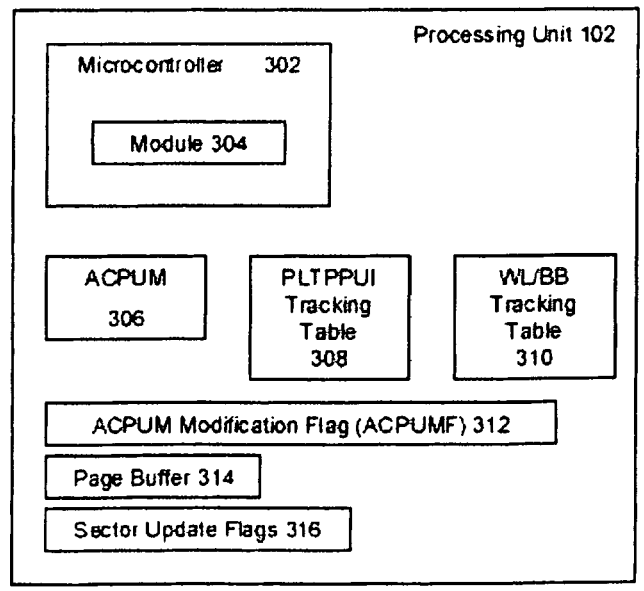
FIG. 3 is a simplified block diagram illustrating salient components of an exemplary processing unit of each of the electronic flash memory devices of FIGS. 1(A) and 1(B), according to an embodiment of the present invention.

FIG. 3 is a simplified block diagram showing salient components of the process unit 102 of an electronic flash memory device in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, ..., $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in an ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFFF'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 90 of FIG. 1(A)) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which, the process 500 writes the contents of the ACPUM 306 to one of a plurality of first special logical addresses (e.g., '0xFFFF0000' for PLTPPUI0, or '0xFFFF0001' for PLTP-PUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5A:
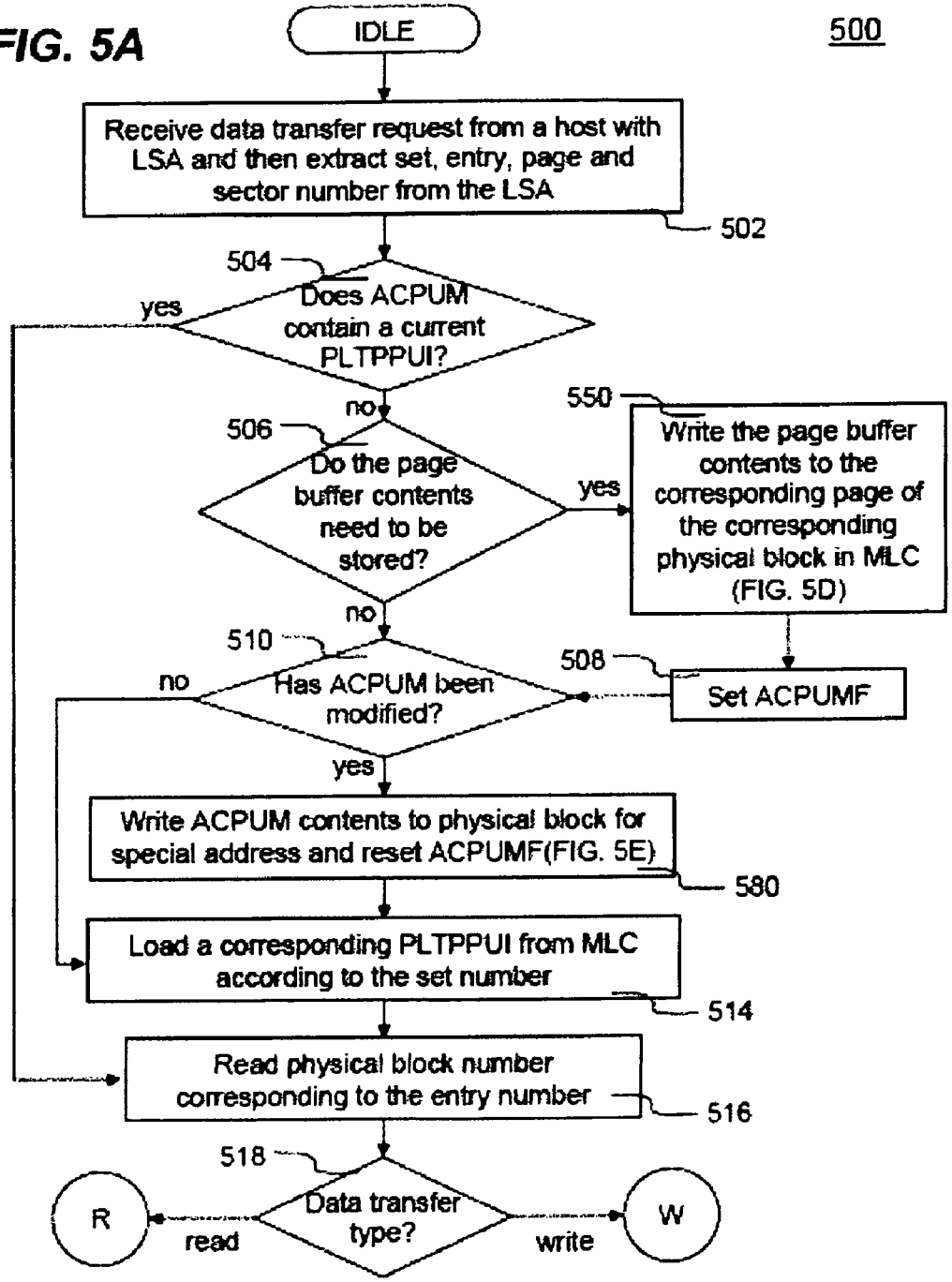
FIGS. 5A-5E collectively show a flow chart of an exemplary process of conducting data transfer requests of the flash memory of FIG. 2A in accordance with one embodiment of the present invention.
Figure 5B:
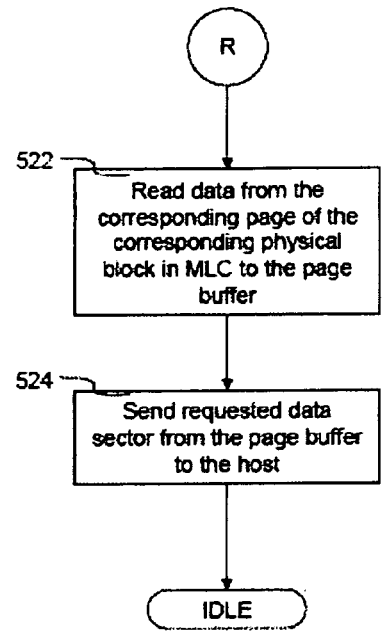

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

Figure 5C:
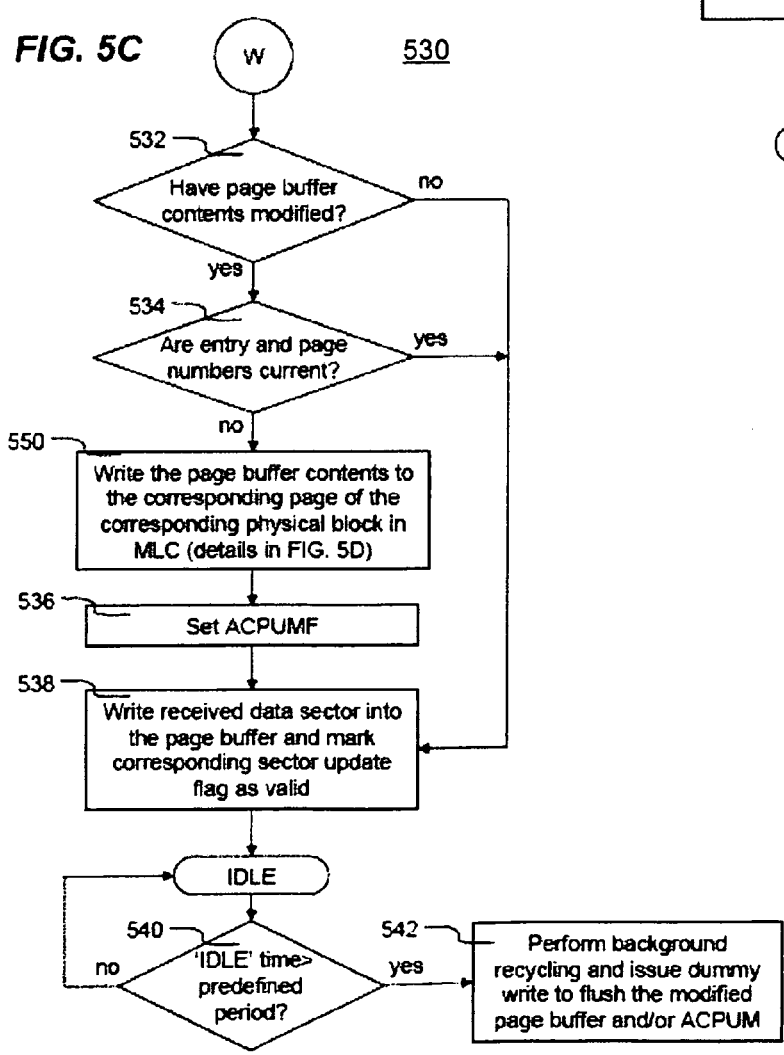

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Figure 5D:
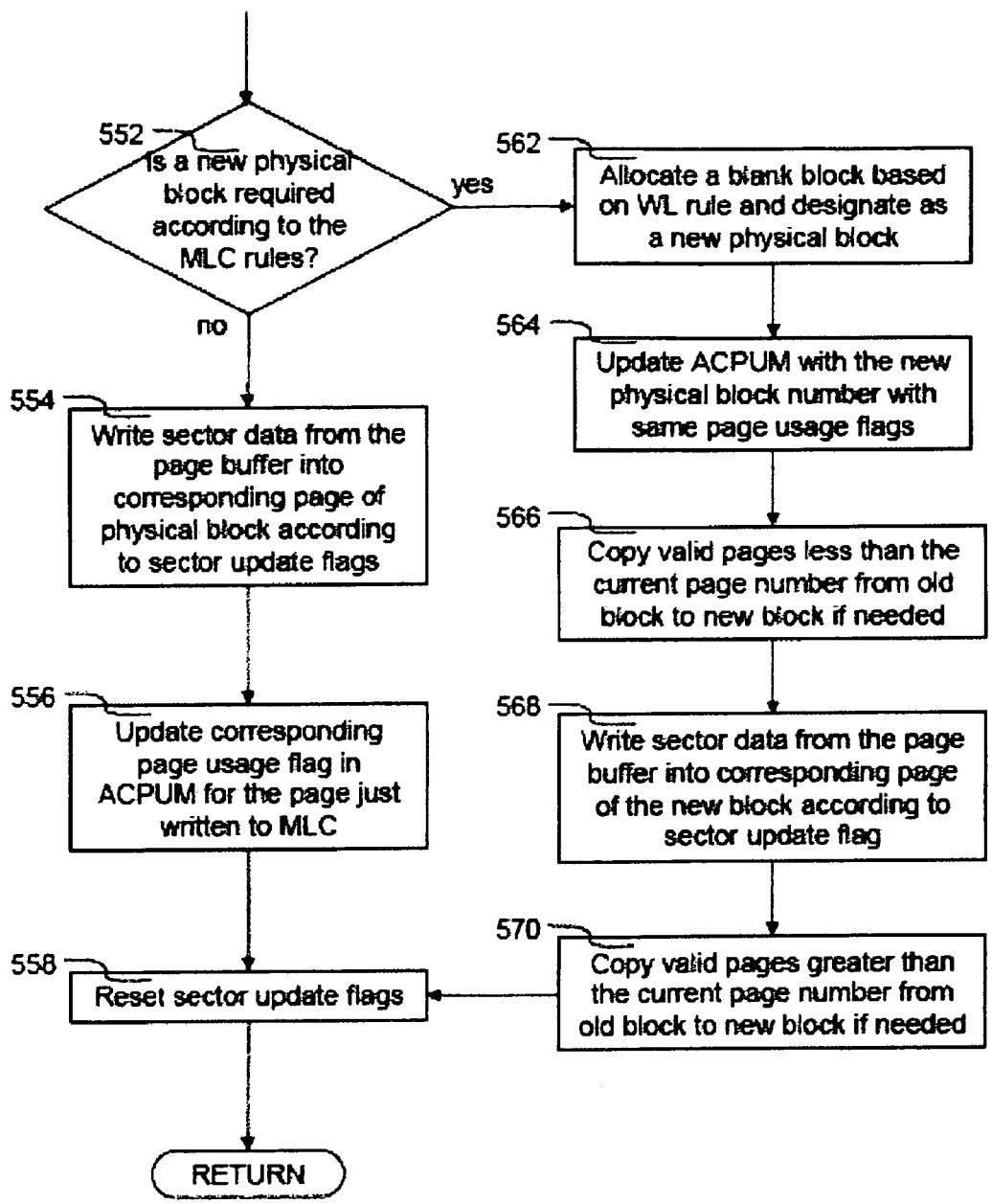

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

Figure 5E:
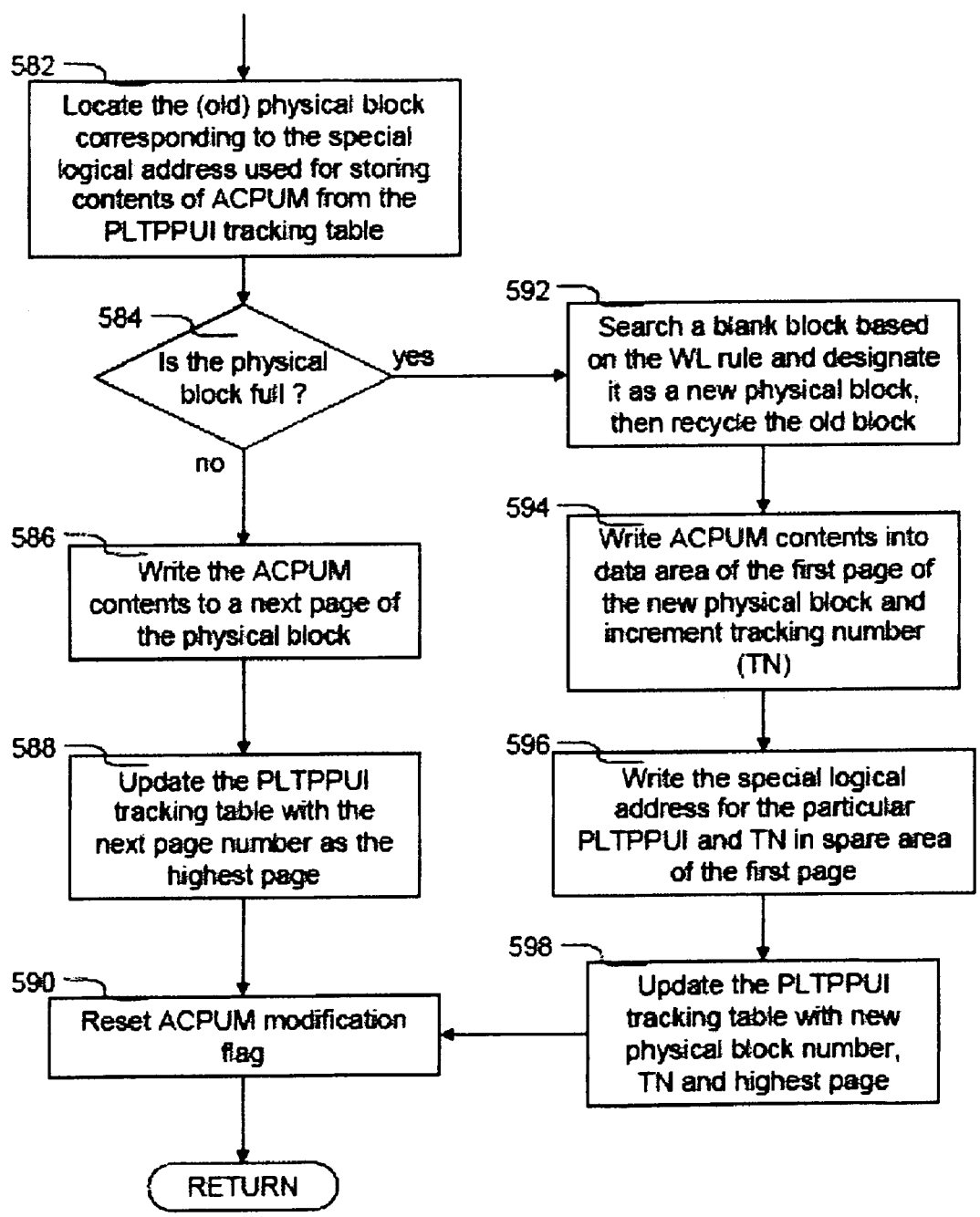

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLT-PPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g. old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTPPUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'un-modified' status. The sector data (S0) is written to the first sector of the page buffer 610 and the corresponding flag in the sector update flags 612 is set to a 'V' for valid data. The corresponding path in the process 500 for writing LSA=0 is as follows:
(1) receiving an LSA=0 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (no);
(6) writing received data sector (S0) into the page buffer and marking corresponding sector ($1^{st}$) update flag at 538; and
(7) going back to 'IDLE' for next data transfer request.

The next data write request (b) is to write to LSA=1. The corresponding path is the process 500 is as follows:
(1) receiving an LSA=1 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S1) into page buffer and marking corresponding sector ($2^{nd}$) update flag at 538; and
(8) going back to 'IDLE' for next data transfer request.

Figure 6A:
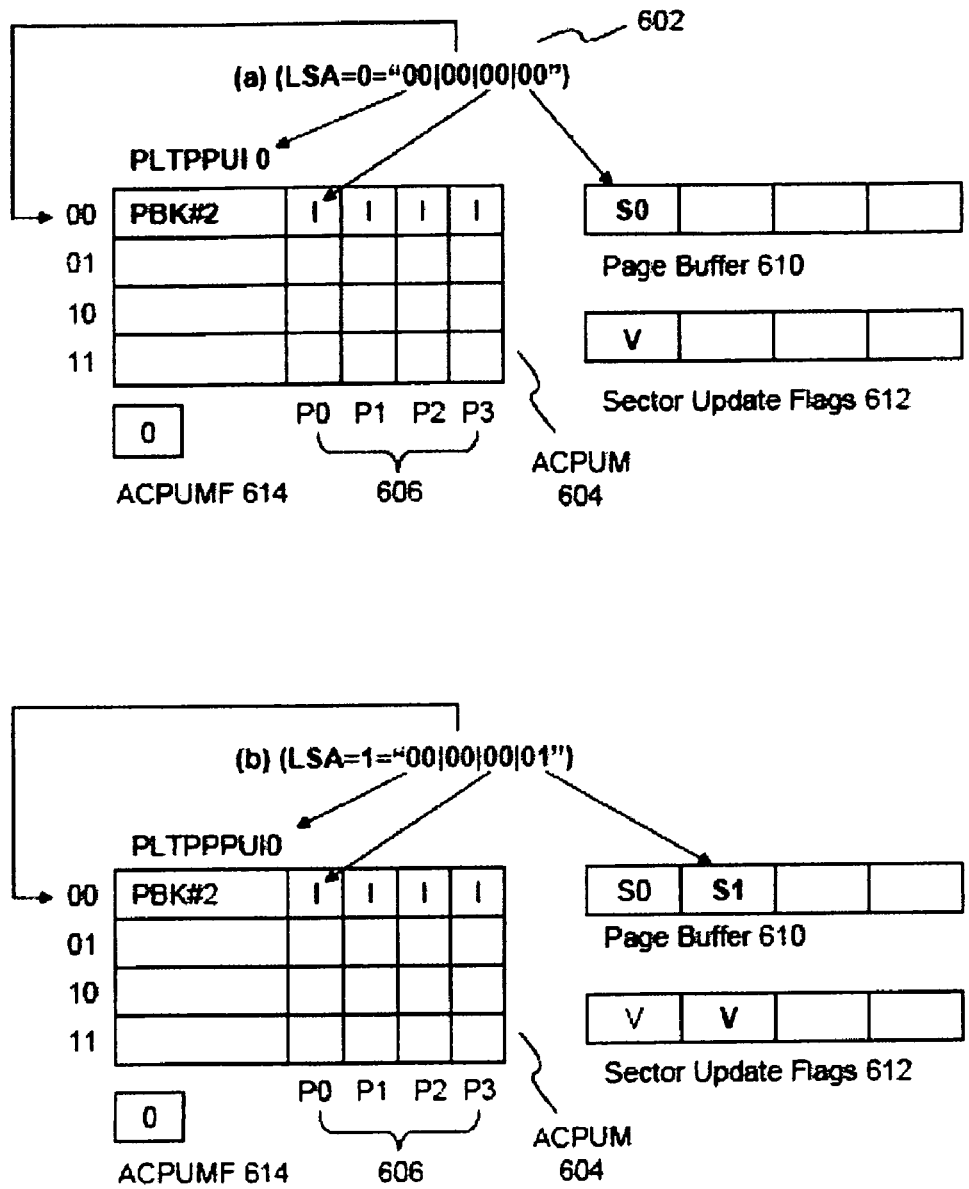
FIGS. 6A-6E collectively show a sequence of data write requests to demonstrate the exemplary process 500 of FIGS. 5A-5E.
Figure 6B:
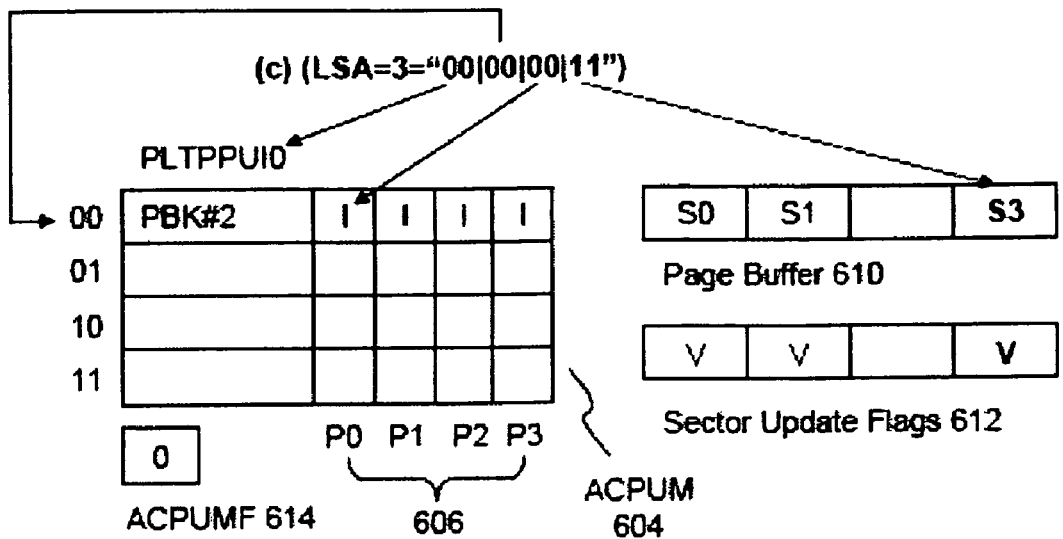
Figure 6B:
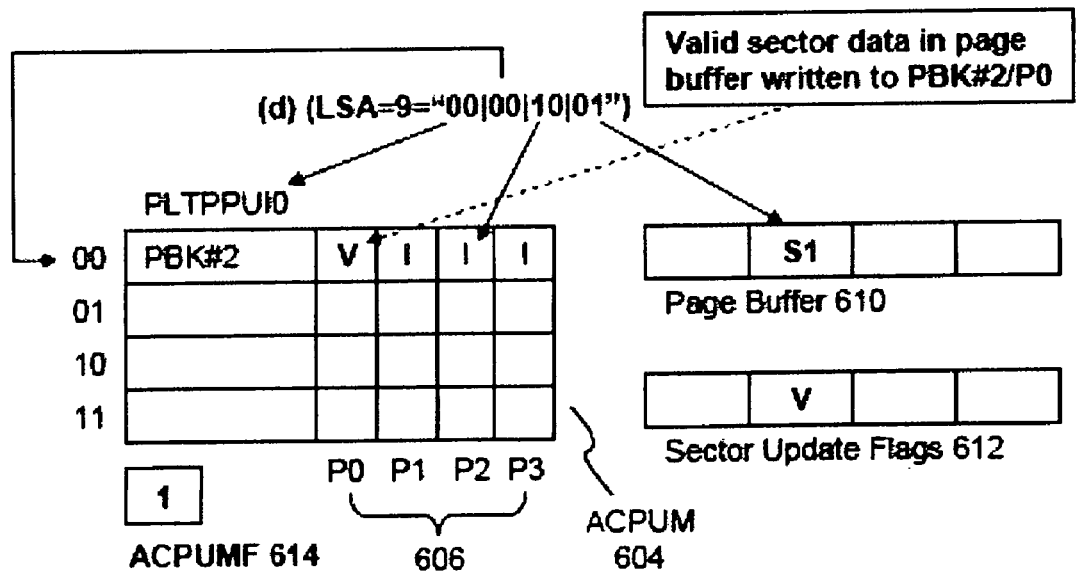

The next data write request (c) is to write to LSA=3 (FIG. 6B). The corresponding path is the process 500 is as follows:
(1) receiving an LSA=3 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (yes);
(7) writing received data sector (S3) into the page buffer and marking corresponding sector ($4^{th}$) update flag at 538; and
(8) going back to 'IDLE' for next data transfer request.

The next data write request (d) is to write to LSA=9 (FIG. 6B). The corresponding path is the process 500 is as follows:
(1) receiving an LSA=9 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (no, same block but different page);
(7) writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
(8) setting the ACPUMF (i.e., 1 for 'modified') at 536; and
(9) writing received data sector (S1) into the page buffer and marking corresponding sector ($2^{nd}$) update flag at 538 before going back to "IDLE".

Figure 6C:
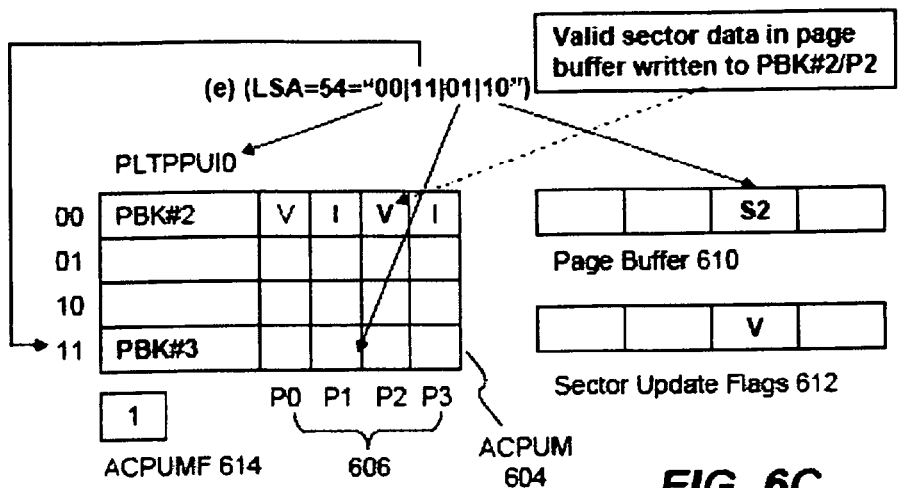

The next data write request (e) is to write to LSA=54 (FIG. 6C). The corresponding path is the process 500 is as follows:
(1) receiving an LSA=54 and extracting set, entry, page and set numbers at 502;
(2) determining whether ACPUM contains a current set of PLTPPUI at 504 (yes, PLTPPUI0);
(3) reading physical block number (PBK#3) at entry 3 (i.e., binary '11') at 516;
(4) determining data transfer request type at 518 (write);
(5) determining whether page buffer contents have been modified at 532 (yes);
(6) determining whether page and block number current at 534 (no, different block);
(7) writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
(8) setting the ACPUMF (i.e., 1 for 'modified') at 536; and
(9) writing received data sector (S2) into the page buffer and marking corresponding sector ($3^{rd}$) update flag at 538 before going back to "IDLE".

Figure 6D:
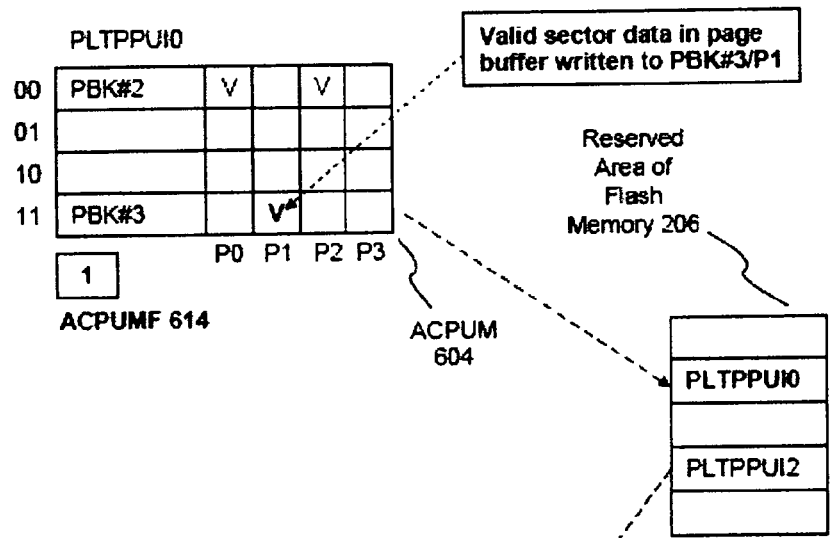
Figure 6D:
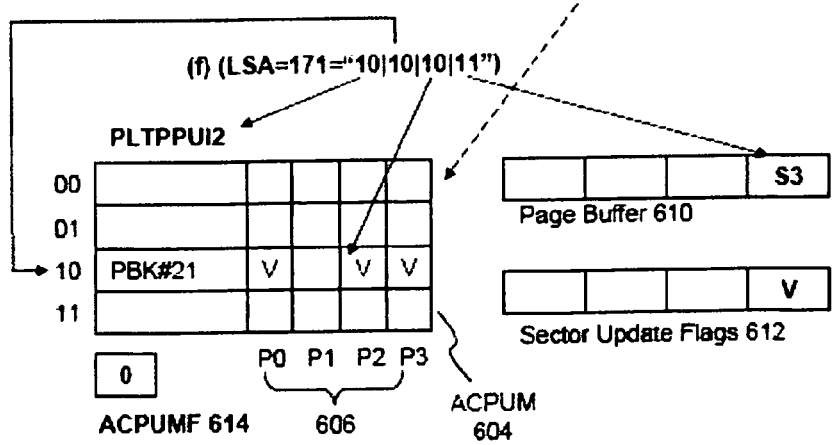

Finally, the next data write request (f) is to write to LSA=171 (FIG. 6D). The corresponding path is the process 500 is as follows:
(1) receiving an LSA=171 and extracting set, entry, page and set numbers at 502;
(2) determining whether ACPUM contains a current set of PLTPPUI at 504 (no, PLTPPUI0 does not match PLTPPUI2);
(3) determining whether the page buffer contents need to be stored at 506 (yes);
(4) writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)

(5) determining whether ACPUM has bee modified at 510 (yes);

(6) writing the ACPUM contents to corresponding physical block corresponding to the first special logical address for particular one of the N sets of PLTPPUI (PLTPPUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');

(7) loading a corresponding set of PLTPPUI (PLTPPUI2) from MLC to ACPUM at 514;

(8) reading physical block number (PBK#21) at entry 2 (i.e., binary '10') at 516;

(9) determining data transfer request type at 518 (write);

(10) determining whether page buffer contents have been modified at 532 (no);

(11) writing received data sector into the page buffer ad marks the corresponding one of the sector update flags at 538 before going back to the 'IDLE' state;

(12) determining whether the 'IDLE' time has exceeded a predefined period at 540 (yes); and

Figure 6E:
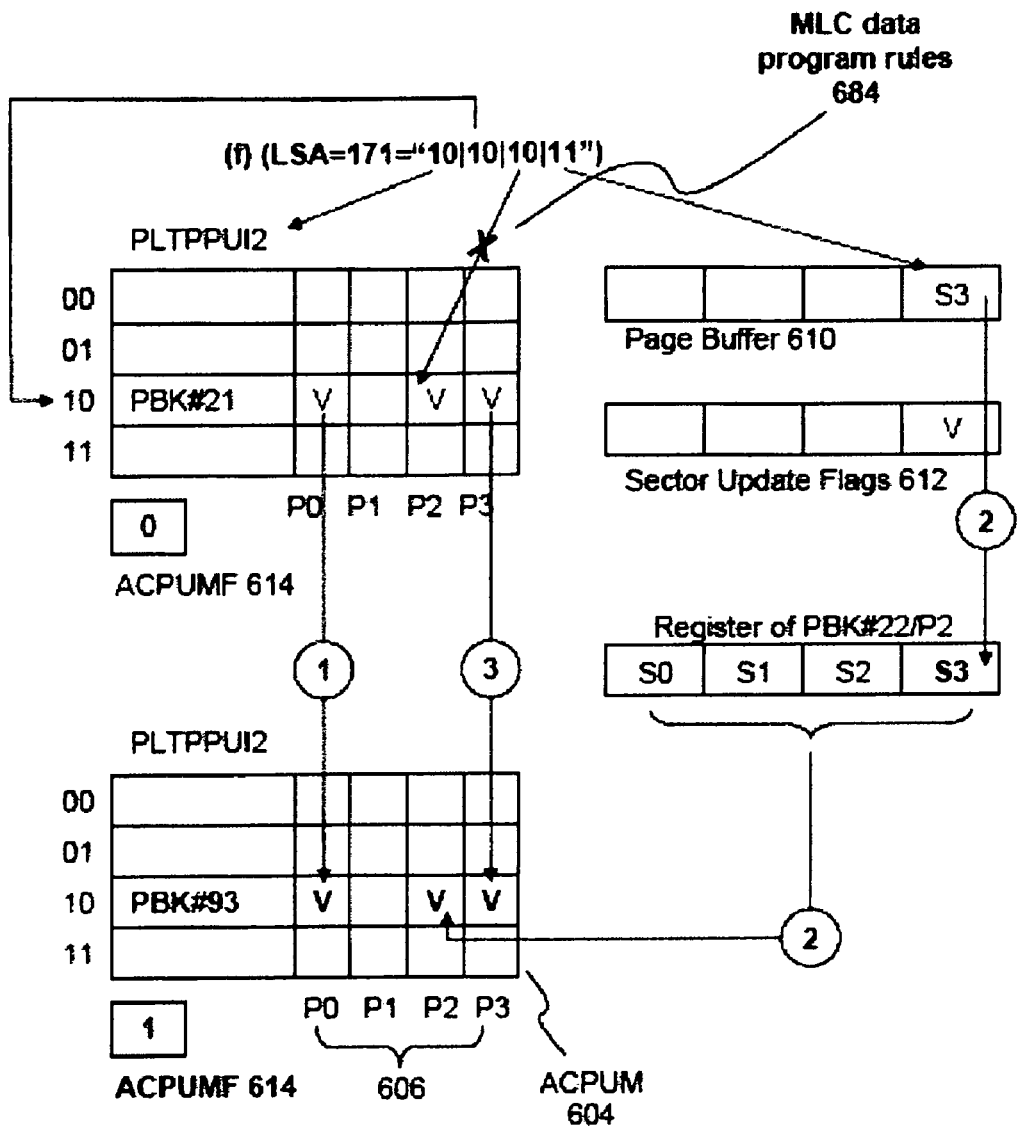

(13) performing background recycling of old blocks with stale data and writing the modified page buffer and ACPUM to MLC at 542 (more details in FIG. 6E).

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:

(1) determining a new physical block is required according to the MLC rules at 552 (yes);

(2) allocating and assigning a new block based on the wear leveling rule at 554;

(3) updating the ACPUM 604 with the new block number (PBK#93) and same page usage flags at 564;

(4) if required, copying the valid pages with page number smaller than the current page number (i.e., P2 or $3^{rd}$ page derived from LSA) from the old block (PBK#21) to the new block PBK#93 at 566 (see STEP 1 in circle in FIG. 6E);

(5) writing sector data (S3) from the page buffer to the register of the corresponding page of PBK#93 and thus updating the page in PBK#93 at 568 (see STEP 2 in circle in FIG. 6E);

(6) if required, copying the valid pages with page number greater than the current page number (i.e., P2 or $3^{rd}$ page derived from LSA) from the old block (PBK#21) to the new block PBK#93 at 570 (see STEP 3 in circle in FIG. 6E); and (7) resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLTPPUI tracking table corresponding to the first special logical address. Finally, the process 700 increments the physical block count 'PBK#' by one at 724, then moves to decision 726 to determine either moving back to 714 for processing another physical block or ending the step 710.

Figure 7A:
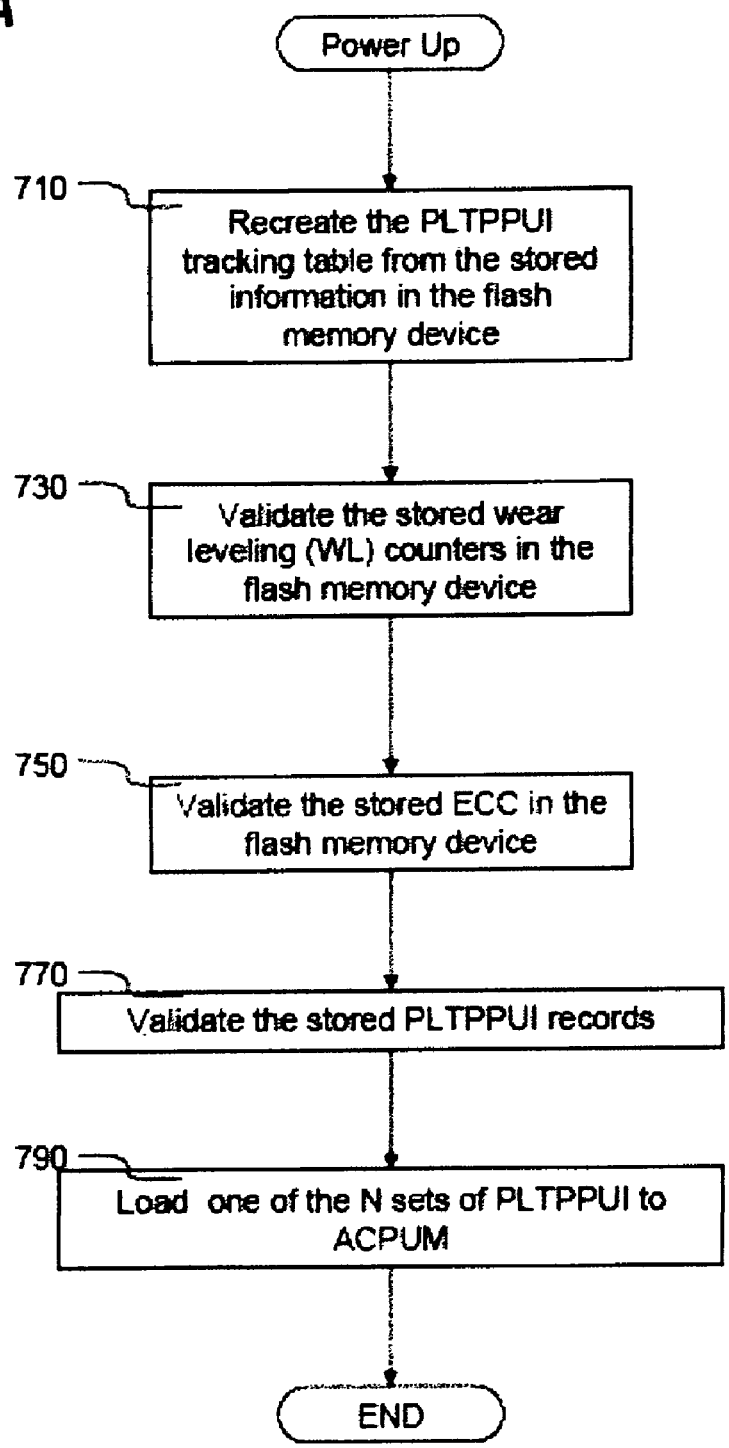
Figure 7C:
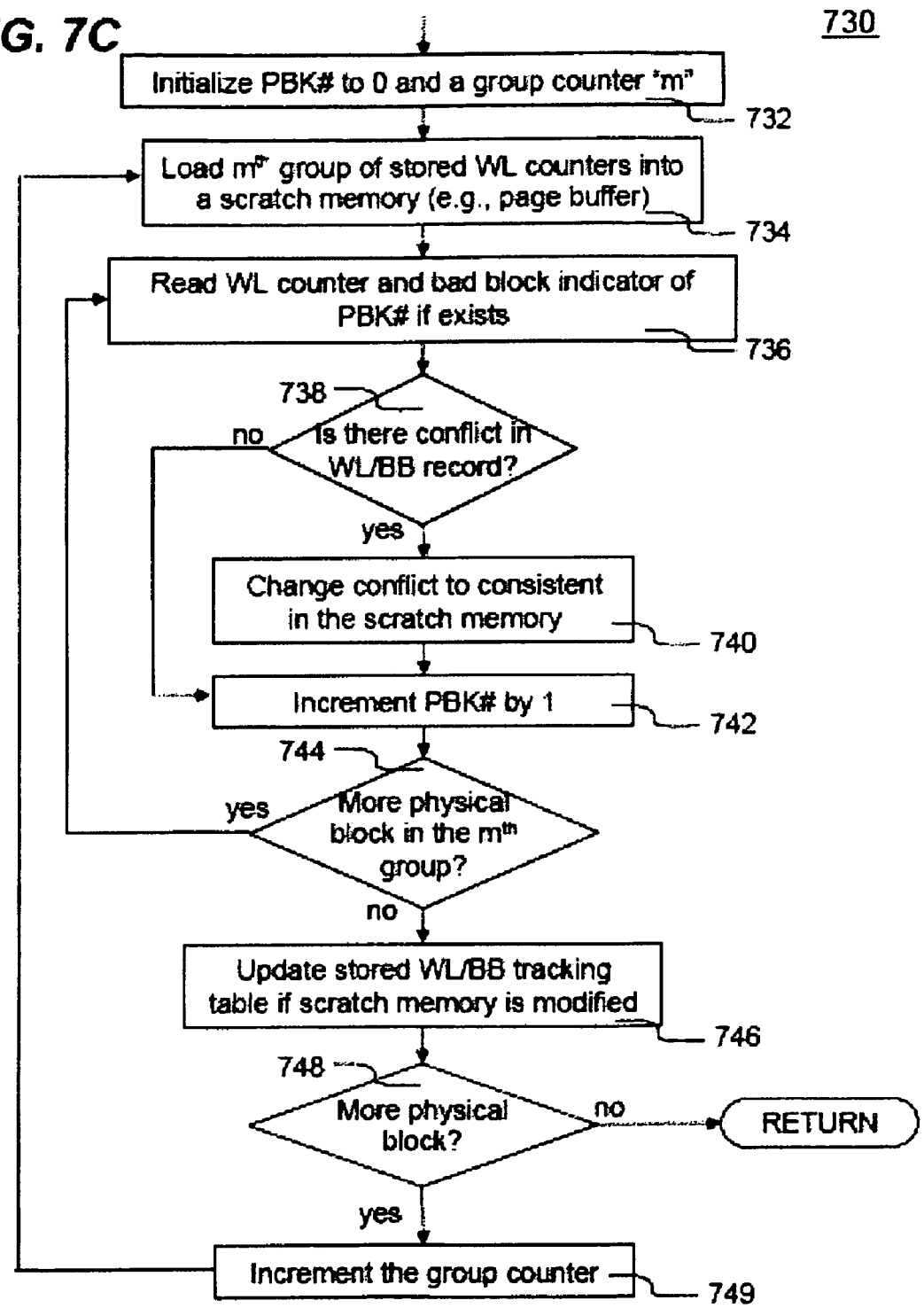

Details of step 730 are shown in FIG. 7C. At 732, the process 700 initializes a physical block counter 'PBK#' and a group counter 'm' to zero. Next, the process 700 loads a '$m^{th}$' group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the '$m^{th}$' group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
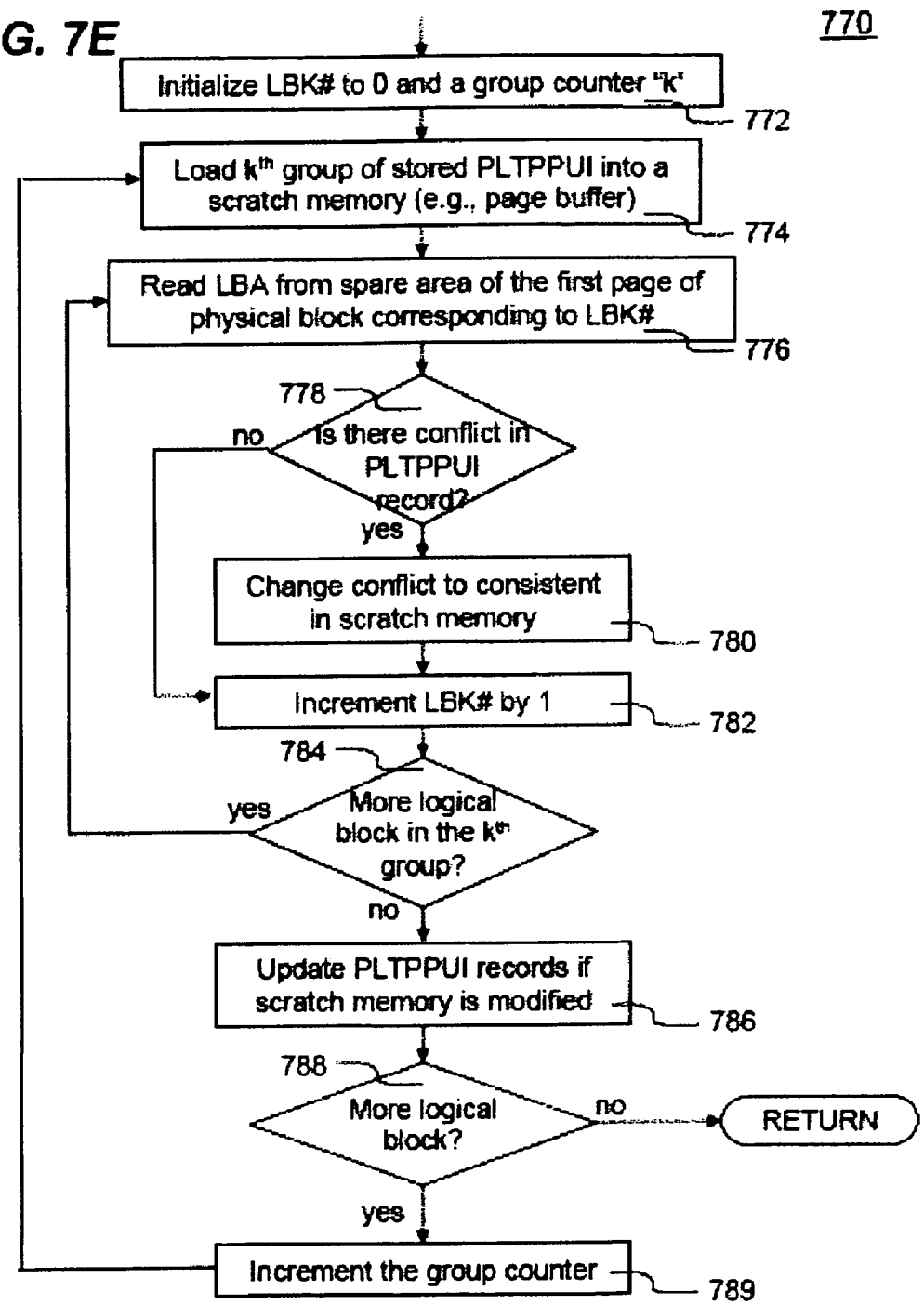

FIG. 7E shows details of step 770. At 772, the process 700 initializes a logical block counter 'LBK#' and a group counter 'k' to zero. The process 700 loads a '$k^{th}$' group of stored PLTPPUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the '$k^{th}$' group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

Referring again to FIG. 1(A), in one embodiment the present invention is directed to a pocket-sized, press-push, pen-type (i.e., retractable) portable computer peripheral device 100-1 that allows positioning plug connector 150 into either a deployed position (indicated in FIG. 1(A) by solid lines) or a retracted position (indicated in FIG. 1(A) by dashed lines). In particular, peripheral device 100-1 includes an elongated housing 110 having a front portion 111 defining a front end (second) opening 112, and defines an internal region surrounded by walls that is sized to allow slidable movement of PCBA 120 between the deployed and retracted position, as shown in FIG. 1(A). Plug connector 150 is fixedly connected to PCBA 120, which includes several electronic devices (e.g., I/O interface circuit 125, processing unit 122 and MLC based flash memory chip 123, all described in detail above), and is disposed to protrude through front opening 112 when moved into the deployed position (e.g., such that plug connector 150 can be plugged into female socket 95 of host computing device 90, as shown in FIG. 1(A) in solid lines).

According to an aspect of the invention, device 100-1 includes a locking mechanism for maintaining plug connector in each of the retracted and deployed position. For example, as indicated by the simplified embodiment of FIG. 1(A), housing 110 defines at least one additional actuator (first) opening 115, and an actuator button 163 is disposed on PCBA 120 such that it extends through actuator opening 115. Actuator opening 115 is defined, for example, in a side wall (as shown in FIG. 1(A)) or a rear end wall of housing 110. Actuator button 163 includes one or more engaging members (e.g., pawls 164-1 and 164-2), and housing 110 includes one or more corresponding engaging members (e.g., grooves 116-1 and 116-2). When plug connector is moved into the deployed position (indicated by solid lines in FIG. 1(A)), pawl 164-1 engages groove 116-1, thereby preventing movement of PCBA 120 inside housing 110 until a release operation (e.g., pushing or pulling on button 163) is manually performed by a user. Conversely, when plug connector is moved into the retracted position (indicated by dashed lines in FIG. 1(A)), pawl 164-2 engages groove 116-2, thereby securing PCBA 120 inside housing 110.

Figure 1B:
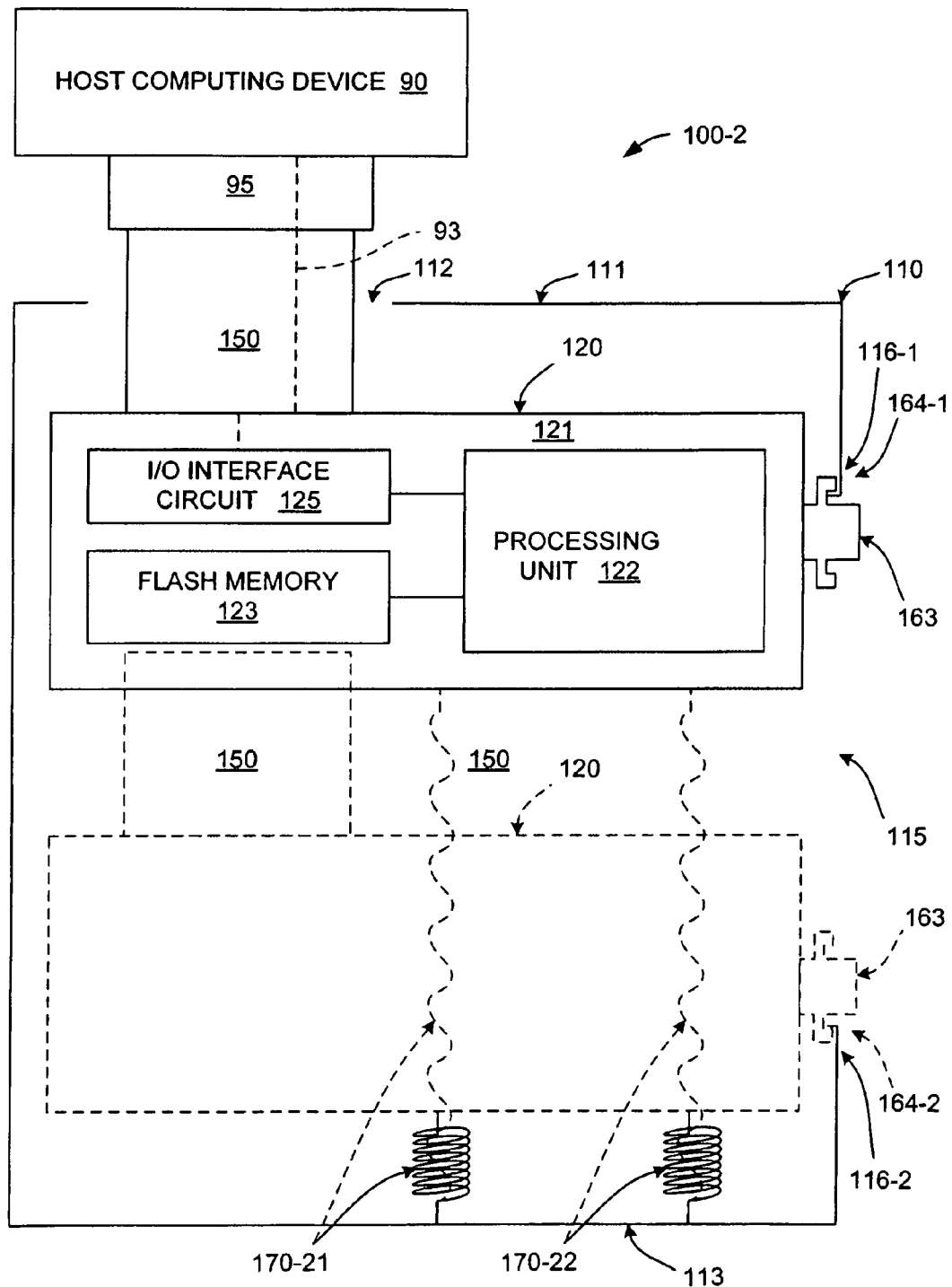

According to another aspect of the present invention, button 163 and the locking mechanism formed by pawls 164-1/2 and grooves 116-1/2 form part of a positioning mechanism 160 that also includes at least one resilient member (e.g., springs 170-11 and 170-12, shown in FIG. 1(A), or springs 170-21 and 170-22 shown in FIG. 1(B), which discloses a device 100-2 that is otherwise identical to device 100-1) that are provided for biasing plug connector 150 between the deployed position and the retracted position. In the example shown in FIG. 1(A), springs 170-11 and 170-12 are coupled at one end to plug connector 150 (e.g., by way of PCBA 120) and at the other end to housing 110. That is, at least one resilient member is connected between plug connector 150 and either to front portion 111 of housing 110 (e.g., as indicated by springs 170-11 and 170-12 in FIG. 1(A)) or rear portion 113 (e.g., as indicated by springs 170-21 and 170-22 in FIG. 1(B)) of housing 110, depending on whether the resilient member intended to deploy or retract the plug connector 150. For example, springs 170-11 and 170-12 are disposed to perform a spring-loaded retraction function, whereby when plug connector 150 is deployed from housing 110 by pressing and sliding actuating button 163 to stretch springs 170-11 and 170-12 until pawl 164-1 engages locking groove 116-1 and plug connector protrudes through front end opening 115, springs 170-11 and 170-12 are stretched (indicated by dashed line) such that they store mechanical energy. When this spring-loaded mechanism is subsequently released (i.e., button 163 is subsequently manipulated to disengage pawl 164 from groove 116-1), the energy stored in springs 170-11 and 170-12 causes springs 170-11 and 170-12 to return to its unstretched shape (indicated by solid line in FIG. 1(A)), thereby biasing plug connector 150 from the deployed position to the retracted position. Conversely, as shown in FIG. 1(B), springs 170-21 and 170-22 are disposed to perform a spring-loaded deployment function, whereby when plug connector 150 is deployed from housing 110 and pawl 164 is engaged into locking groove 116-2 (indicated by dashed lines in FIG. 1(B)), springs 170-21 and 170-22 are stretched (indicated by dashed lines in FIG. 1(B)) such that they store mechanical energy. When this spring-loaded mechanism is subsequently released (i.e., button 163 is subsequently manipulated to disengage pawl 164 from groove 116-2), springs 170-21 and 170-22 bias plug connector 150 from the deployed position (energy stored) into the retracted position, and springs 170-21 and 170-22 return to their original shape (indicated by solid lines in FIG. 1(B)). By utilizing springs 170-11/12 (FIG. 1(A)) or 170-21/22 (FIG. 1(B)) to retract or deploy plug connector 150 in this manner, the present invention provides a computer peripheral device having a desirable spring-loaded deploying/retracting feature that protects plug connector 150 without the need for a separate cap.

Various MLC retractable flash memory device embodiments incorporating the mechanism described with reference to FIGS. 1(A) and 1(B) will now be described. Each of these devices includes a sliding rack which is enclosed inside a housing structure in which a USB plug connector could be extended out or retracted in by sliding a slide button either on the top or on the side of the housing structure, or by pressing the rear push button of the housing in accordance with the specific embodiments set forth below.

Figure 8A:
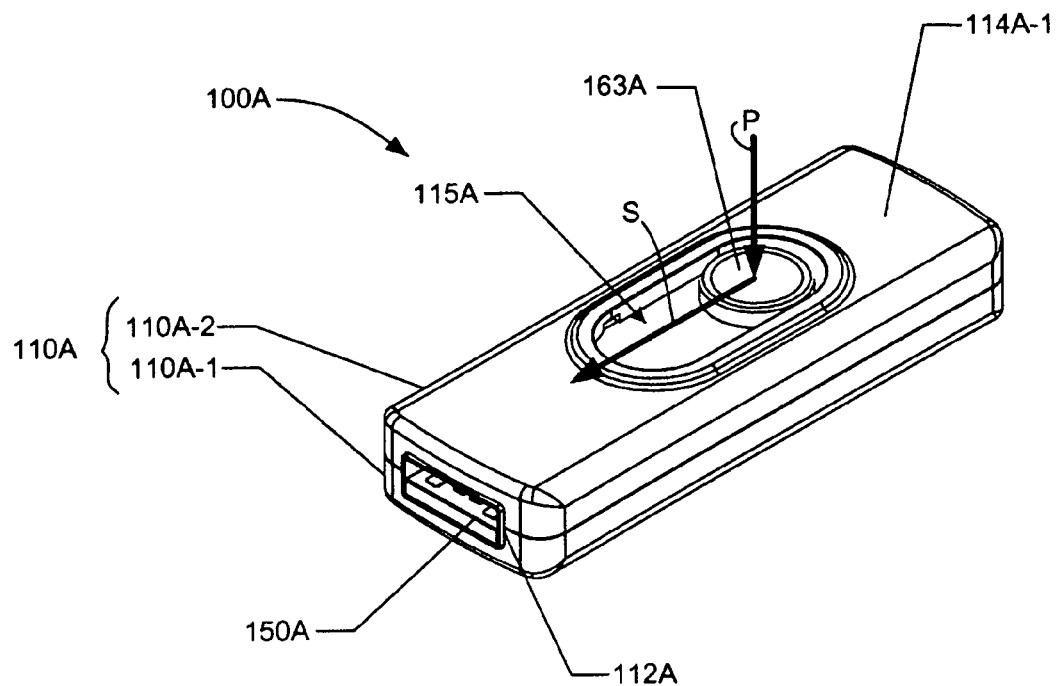
FIGS. 8(A) and 8(B) are perspective views showing a pen-type computer peripheral device in alternative closed and open positions, respectively, according to an embodiment of the present invention.
Figure 8B:
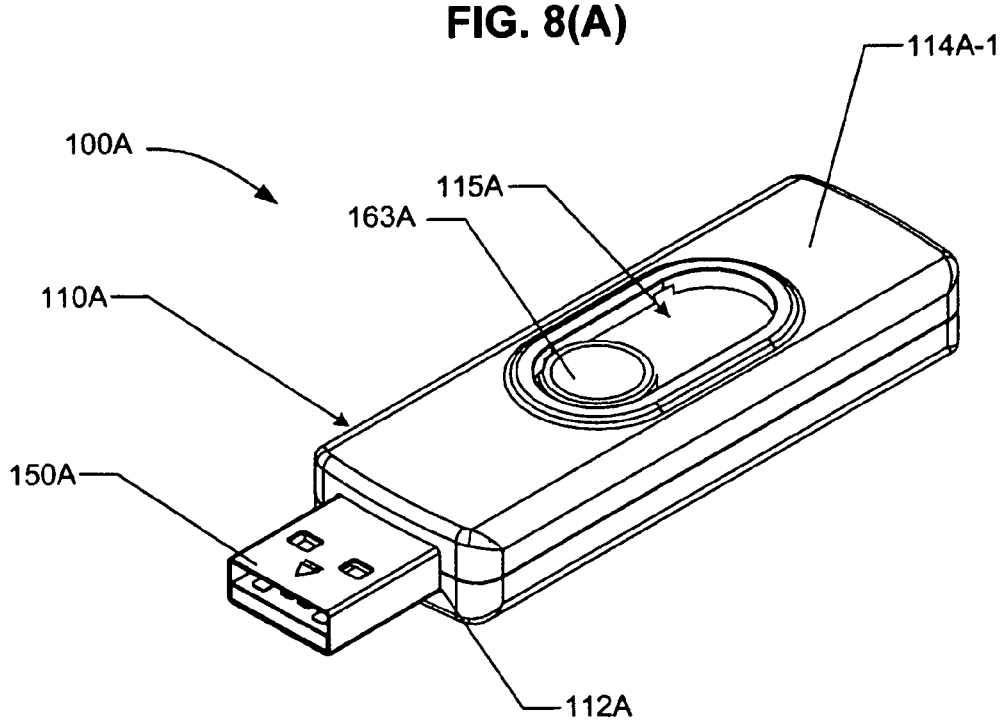

FIGS. 8(A) and 8(B) are perspective top views showing a pocket-sized, pen-type (i.e., retractable) portable computer peripheral device 100A having a retractable Universal Serial Bus (USB) plug connector 150A according to a first specific embodiment of the present invention. In this embodiment the flash memory device is a slide MLC USB flash drive including the MLC based flash memory chip described in detail above. As shown in FIG. 8(A), in a fully retracted position, USB plug connector 150A is retracted through a front opening 112A defined by elongated housing 110A such that connector 150A is safely disposed inside housing 110A. A press-push button 163A is integrally connected to a positioning member (not shown, described below) and is partially exposed through a slot 115A to facilitate manual movement from the fully retracted (first) position shown in FIG. 8(A), to the fully deployed (second) position shown in FIG. 8(B). In particular, plug connector 150A is deployed from housing 110A by pressing press-push button 163A in the direction of arrow P, which releases mechanical energy stored in a pair of linear springs (described below), causing button 163A to slide forward along slot 115A (i.e., in the direction of arrow S in FIG. 8(A)). When plug connector 150A is deployed/exposed outside housing 110A, peripheral device 100A can be plugged into a host computer and function in the programming, data retrieving, and data resetting modes described above. Once the desired operations are completed, plug connector 150A is retracted into housing 110A by pressing press-push button 163A and manually pulling backward, which causes button 163A to retract backward along slot 115A (i.e., in the direction opposite to arrow S in FIG. 8(A)) to load the linear springs for a future spring-loaded deployment.

Figure 9:
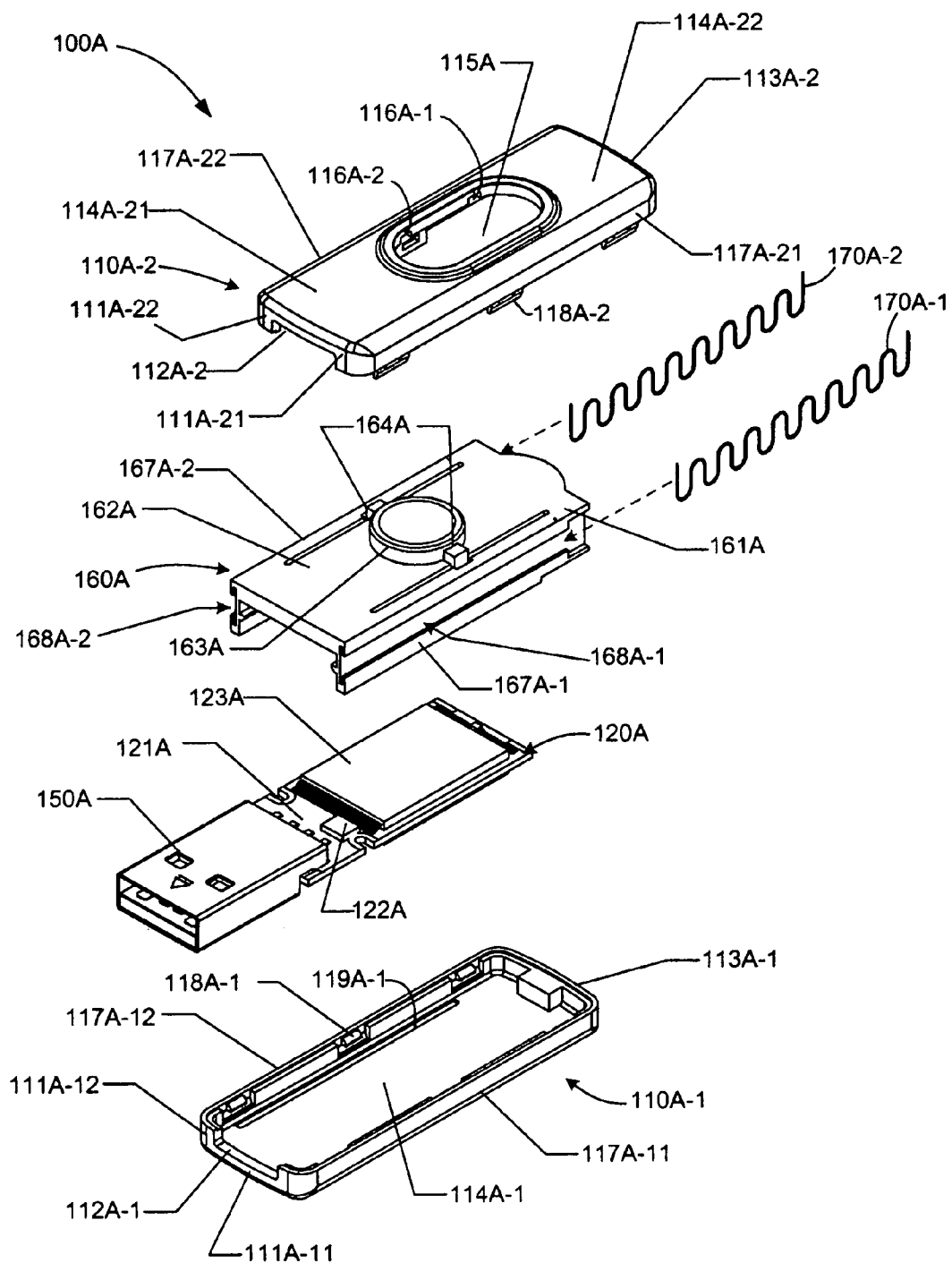
FIG. 9 is an exploded perspective view showing the peripheral device of FIG. 8(A) in additional detail.

FIG. 9 is an exploded perspective view showing device 100A in additional detail. Device 100A generally includes a rectangular two-part housing 110A, a printed circuit board assembly (PCBA) 120A that is mounted inside of housing 110A, a manual (slide) positioning member 160A mounted on PCBA 120A, and a pair of metal flat springs 170A-1 and 170A-2.

As indicated in FIG. 8(A) and shown in FIG. 9, two-part molded plastic housing 110A includes a lower (first) portion 110A-1 and an upper (second) portion 110A-2.

As shown at the bottom of FIG. 9, lower portion 110A-1 includes a lower wall 114A-1, first side wall portions 117A-11 and 117A-12, a rear wall portion 113A-1, and front wall portions 111A-11 and 111A-12 defining a front opening portion 112A-1. Connecting tabs 118-A1 protrude from inside surfaces of side walls 117A-11 and 117A-12. Slide tracks (e.g., slide track 119A-1) are defined in lower wall 114A-1.

As shown at the top of FIG. 9, upper portion 110A-1 includes a relatively wide, elongated upper wall that is divided into a front upper wall portion 114A-21 and a rear upper wall portion 114A-22 that are separated by a slot 115A. Extending downward from the upper wall are side walls including outer side wall portions 117A-21 and 117A-22, front wall portions 111A-21 and 111A-22 that define front opening portion 112A-2, and a rear outer wall 113A-2. Connecting slots 118A-2 are defined on inner side walls 117A-21 and 117A-22. Retracted lock grooves 116A-1 and deployed lock grooves 116A-2 are defined in an inside surface of front upper wall portion 114A-21/22.

According to an aspect of the present embodiment, a sliding rack assembly includes PCBA 120A, a USB plug connector 150A, a slide rack (positioning member) 160A, and two linear springs 170A-1 and 170A-2.

Referring to the center of FIG. 9, PCBA 120A includes a printed circuit board (PCB or card) 121A and USB plug (metal) connector 150A that is attached to a front end of PCB 121A using known techniques such that PCB 121A is approximately aligned centered to USB metal connector 150A. As discussed above, PCB 121A includes several ICs (e.g., a controller or processing unit 122A and flash memory 123A) disposed thereon. The ICs are electronically connected together and to connector 150A using known techniques.

Referring to the center of FIG. 9, positioning member 160A includes a base portion 161A and a flexible wall 162A that is connected to base portion 161A such that flexible wall 162A is resiliently bendable relative to base portion 161A in the manner described below. Press-push button 163A extends upward from flat flexible wall 162A. Locking tabs (first locking structures) 164A also extend upward from flat flexible surface 162A next to button 163A. First and second slide rails 167A-1 and 167A-2 are fixedly connected to and extend substantially perpendicular to base portion 161A. Elongated grooves 168A-1 and 168A-2 are respectively formed on slide rails 167A-1 and 167A-2, and are sized to receive linear springs 170A-1 and 170A-2.

As indicated in FIG. 9, during assembly PCBA 120A (with connector 150A already attached) is mounted onto positioning member 160A with plug connector 150A extending from the front thereof, and then PCBA 120A is pressed against positioning member 160A until locking tabs not shown snap into cut-outs provided on PCB 121A. Linear springs 170A-1 and 170A-2 are then slid into corresponding grooves 168A-1 and 168A-2 such that one end of each linear spring is engaged into a locking hole (not shown) defined in positioning member 160A. The assembly is then mounted into lower housing 110A-1 such that slide rails 167A-1 and 167A-2 are slidably engaged in corresponding slide tracks 119A-1, and then upper mounting 110A-2 is mounted over the assembly such that a second end of each linear spring 170A-1 and 170A-2 is engaged into a locking hole (not shown) defined in upper housing 110A-2, and such that a portion of press-push button 163A (which extends from flat flexible wall 162A) is received in slot 115A. Finally, the side walls (e.g., side wall 117A-21) of upper housing portion 110A-2 are aligned to be received by corresponding side walls (e.g., side walls 117A-11 and 117A-12) of lower housing portion 110A-1, and then pressed until locking tabs 118A-1 are snapped into slots 118A-2. In an alternative embodiment, ultrasonic welding may be used in place of the snap-coupling mechanism described above to secure housing portions 110A-1 and 110A-2.

Figures 1, 10:
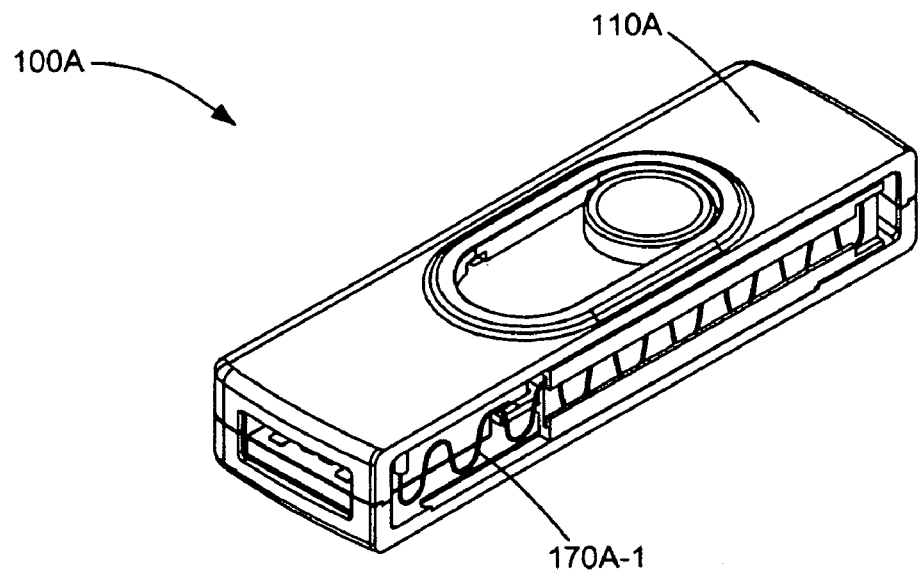
FIGS. 10-1 and 10-2 are partial perspective views depicting the peripheral device of FIG. 8(A) during operation.
Figures 2, 10:
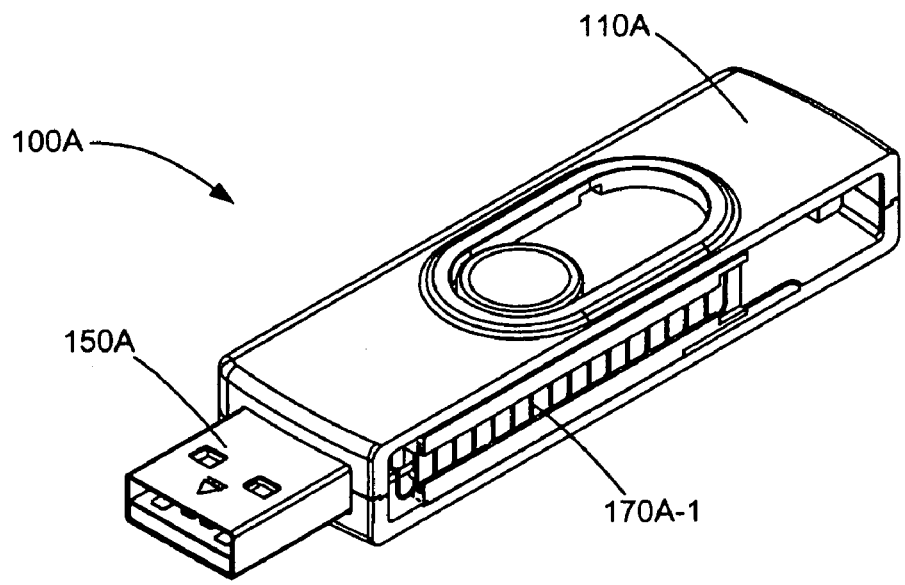
Figure 10A:
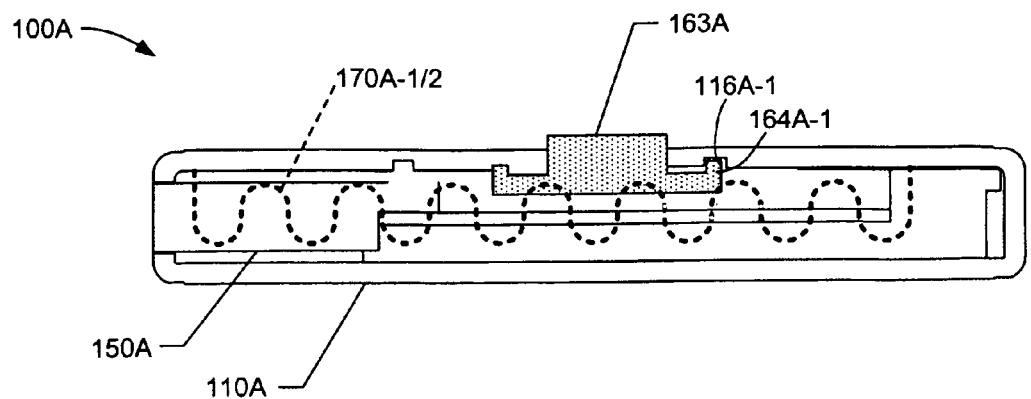
FIGS. 10(A), 10(B) and 10(C) are simplified cross-sectional side views depicting the peripheral device of FIG. 8(A) during operation.
Figure 10B:
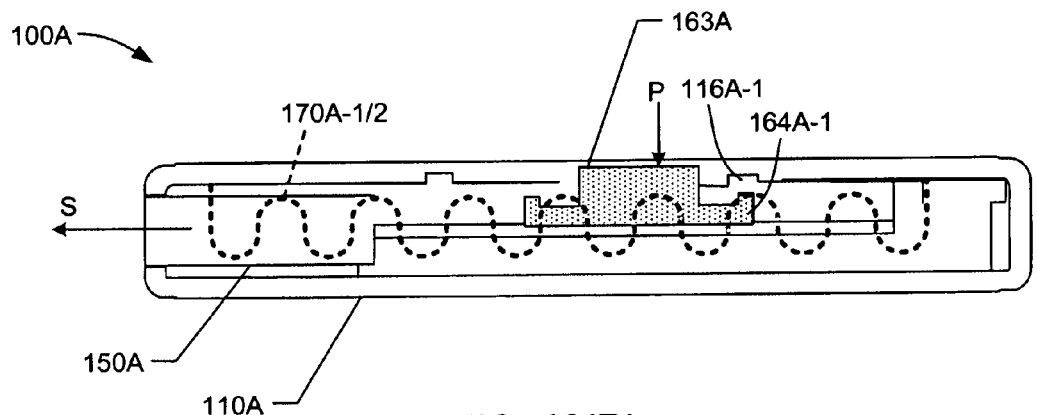
Figure 10C:
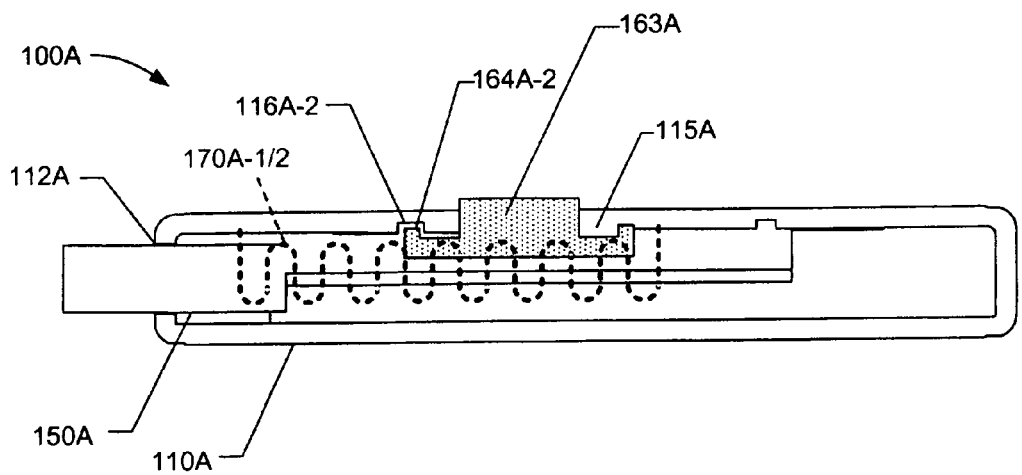

FIGS. 10-1 and 10-2 are partial perspective views depicting peripheral device 100A in the deployed and retracted positions with side walls of housing 110A removed for illustrative purposes, and FIGS. 10(A) to 10(C) are simplified cross-sectional side views showing peripheral device 100A during a deployment operation. In the retracted state shown in FIGS. 10-1 and 10(A), plug connector 150A is disposed inside housing 110A, protrusions (lock tabs) 164A-1 are engaged in rear lock slots 116A-1, and springs 170A-1 and 170A-2 are subjected to stretch/extension. As indicated in FIG. 10(B), pressing down button 163A releases protrusions 164A-1 from rear slot locks 116A-1, causing the sliding rack assembly to be propelled forward (i.e., in the direction of arrow S) by linear springs 170A-1 and 170-2. As indicated in FIGS. 10-2 and 10(C), the plug connector 150A is thus pushed into its deployed position by way of the spring-loaded mechanism such that it extends through front end opening 112A, and is held in the deployed position by front protrusions 164A-2 engaging in front lock slots 116A-2. Note that button 163A is free to move forward due to the clearance provided by slot 115A. Subsequent return to the retracted position requires pressing button 163A downward and manually sliding the assembly back into the retracted position.

Note that connector 150A is sprung forward or backward depending on the coupling orientation of springs 170A-1 and 170A-2 to positioning member 160A and housing 100A. In another alternative embodiment described below, the sliding rack assembly is sprung back to retract the USB plug connector in the housing when pressing the actuating button downward when the plug connector is in the deployed position. Further, the press/push switch (or slide button) mechanism is located on the side of the flash memory device, the top, or the rear; and relies upon the resilient properties of the sliding rack and springs to create a smooth, locking mechanism for the extension or retraction of the USB plug. The slide button must first be depressed inwards, towards the body of flash memory drive, in order for the sliding rack to move between its two locked positions along slide tracks. The extended (front) lock slot/groove and the retracted (rear) lock slot/groove serve to lock the button (top, side, or rear) in either the extended position or retracted position, respectively.

Figure 11A:
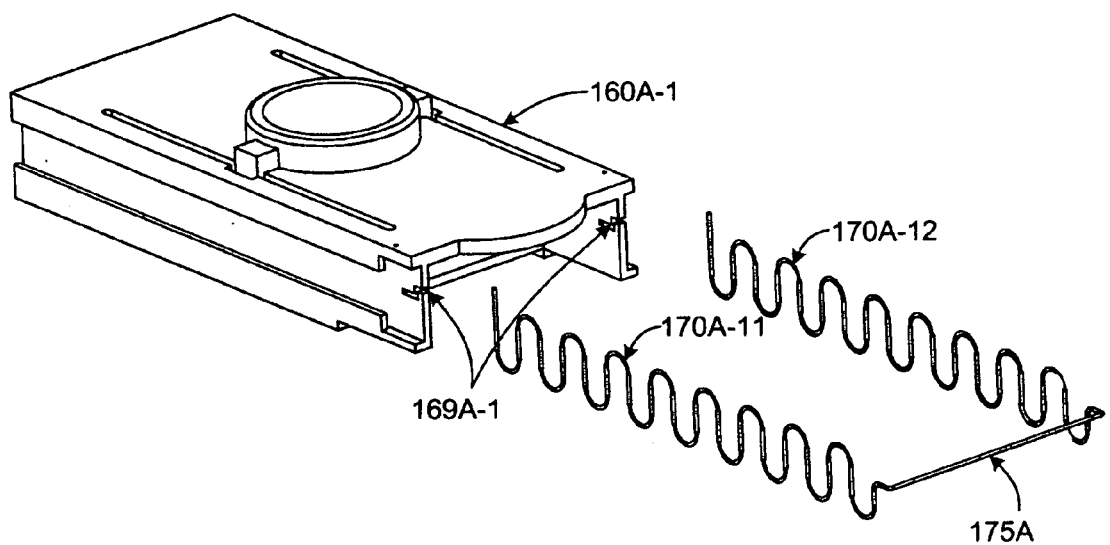
FIGS. 11(A) and 11(B) are exploded perspective and perspective views, respectively, showing a sliding rack assembly of the sliding-rack assembly for a pen-type computer peripheral device similar to that shown in FIG. 8(A) according to an alternative embodiment of the present invention.
Figure 11B:
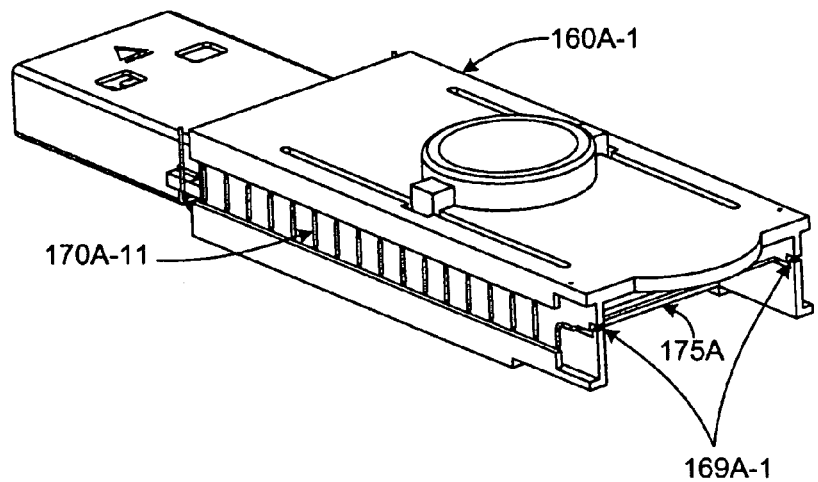

FIGS. 11(A) and 11(B) are partial exploded perspective and perspective views, respectively, showing a sliding rack assembly according to an alternative embodiment in which springs 170A-11 and 170A-12 are connected by way of a cross-bar 175A, and the resulting spring assembly is mounted onto sliding rack 160A-1 in a single piece. Note that sliding rack 160A-1 is essentially identical to sliding rack 160A (described above), but includes rear slots 169A-1 for receiving cross-bar 175A, as indicated by the assembly in FIG. 11(B). This arrangement simplifies the assembly process relative to the two spring embodiment (described above), thereby reducing manufacturing costs.

Figure 12A:
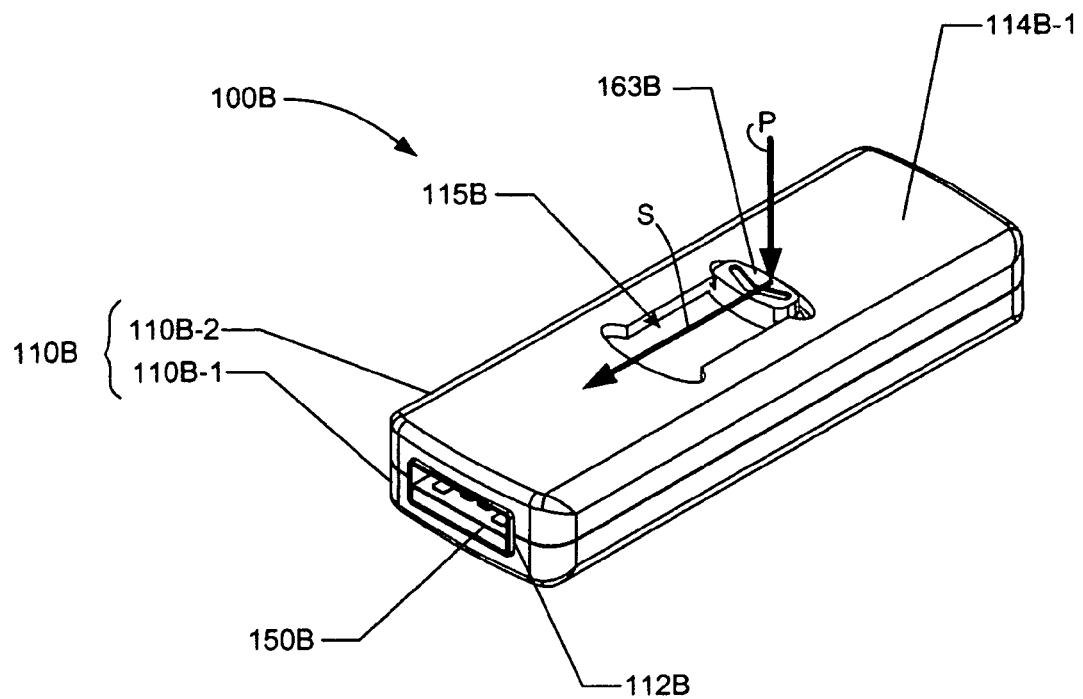
FIGS. 12(A) and 12(B) are perspective views showing a pen-type computer peripheral device in alternative closed and open positions, respectively, according to another embodiment of the present invention.
Figure 12B:
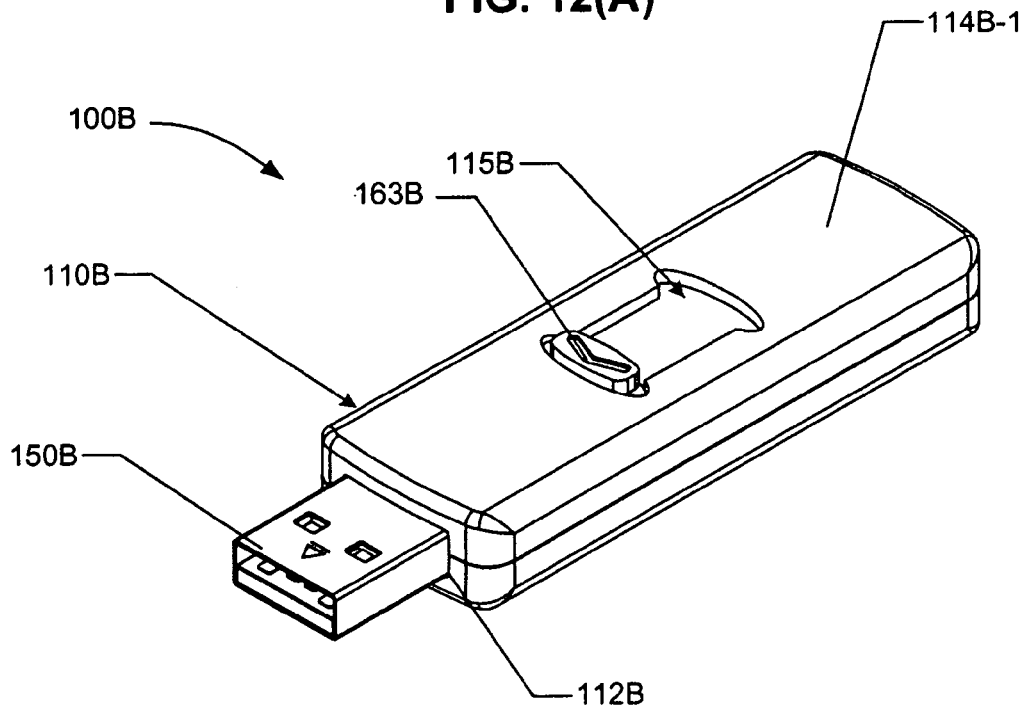

FIGS. 12(A) and 12(B) are perspective top views showing a retractable portable computer peripheral device 100B having a retractable USB plug connector 150B according to another specific embodiment of the present invention. Similar to the first embodiment (described above), in a fully retracted position, USB plug connector 150B is retracted through a front opening 112B defined by elongated housing 110B, a press-push button 163B is integrally connected to a positioning member (not shown, described below) and is partially exposed through a slot 115B to facilitate manual movement from the fully retracted (first) position shown in FIG. 12(A), to the fully deployed (second) position shown in FIG. 12(B). However, unlike the first embodiment, USB plug connector 150B is biased by pair of linear springs that are disposed in housing 110B such that the resilient member biases plug connector 150B from the deployed position shown in FIG. 12(B) to the retracted position shown in FIG. 12(A). That is, to deploy USB plug connector 150B for use, a user manually presses press-push button 163B into housing 110B (i.e., in the direction P indicated by dark arrow in FIG. 12(A)), and then pushes (slides) button 163B along slot 115B toward the front end of housing 110B (i.e., in the direction of arrow S in FIG. 12(A)). This press-push operation causes plug connector 150B to emerge from front end opening 112B such that peripheral device 100B can be plugged into a host computer and function in the programming, data retrieving, and data resetting modes described above. Once the desired operations are completed, plug connector 150B is retracted into housing 110B by pressing press-push button 163B, which releases mechanical energy stored in a pair of linear springs (described below) and causes button 163B to slide backward along slot 115B (i.e., in the direction opposite to arrow S in FIG. 12(A)).

Figure 13:
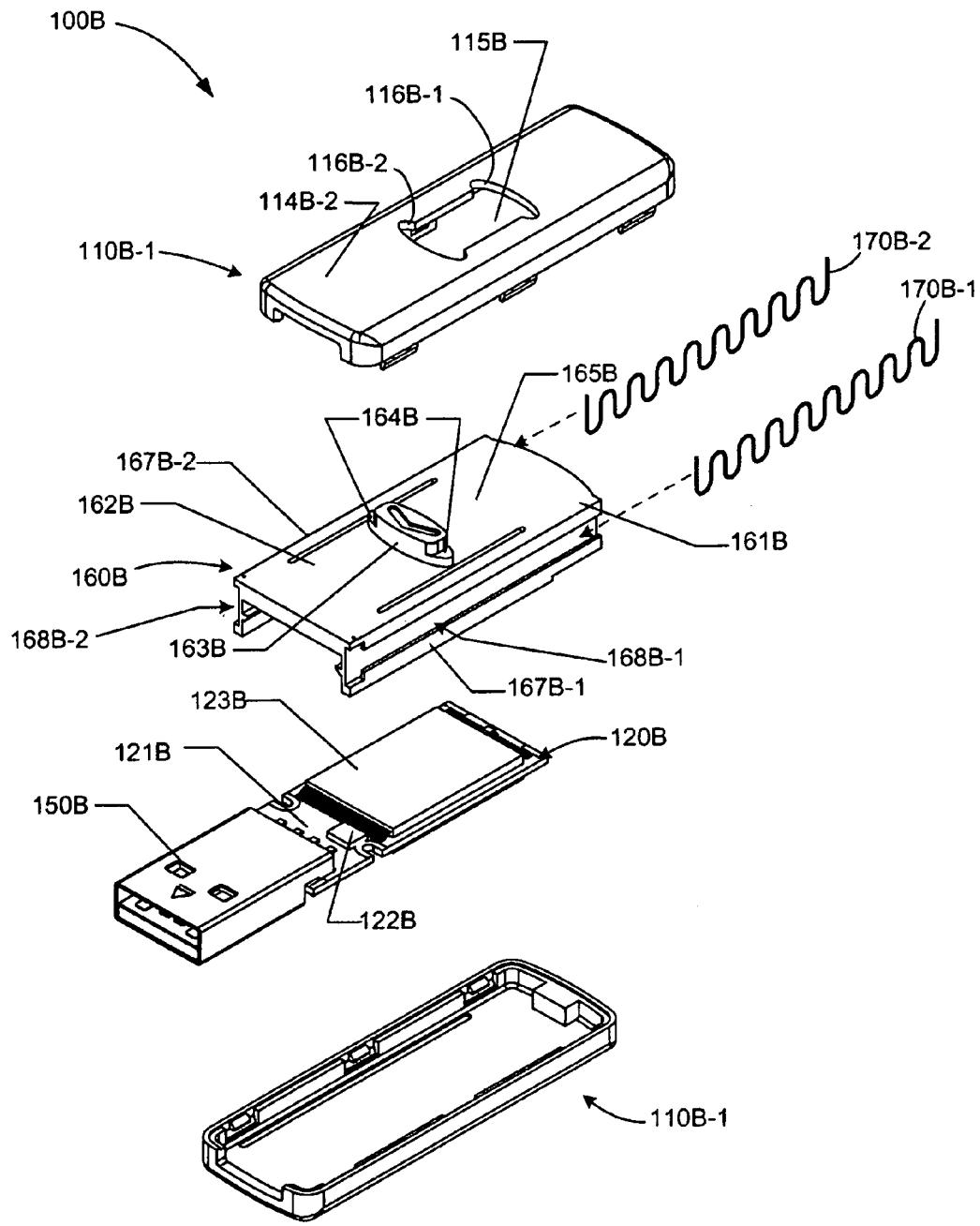
FIG. 13 is an exploded perspective view showing the peripheral device of FIG. 12(A) in additional detail.

FIG. 13 is an exploded perspective view showing device 100B in additional detail. Device 100B generally includes a rectangular two-part housing 110B including a lower portion 110B-1 and an upper portion 110B-2, and a sliding rack assembly includes a PCBA 120B and USB plug connector 150B mounted thereon, a slide rack 160B, and two linear springs 170B-1 and 170B-2 that is mounted inside of housing 110B. Housing 110B is similar to that described in the first embodiment, and differs only in that upper wall portion 114B-2 defines retracted lock grooves 116B-1 and deployed lock grooves 116B-2 at opposing ends of slot 115B. Referring to the center of FIG. 13, positioning member 160B includes a base portion 161B and a flexible wall 162B disposed in a manner similar to that described above. Press-push button 163B is somewhat more oblong than in the first embodiment, and includes locking tabs 164B disposed on each side thereof. Similar to the earlier embodiment, elongated grooves 168B-1 and 168B-2 are respectively formed on slide rails 167B-1 and 167B-2, and are sized to receive linear springs 170B-1 and 170B-2, and assembly of device 100B is substantially the same as that described above for the first embodiment.

Figures 1, 14:
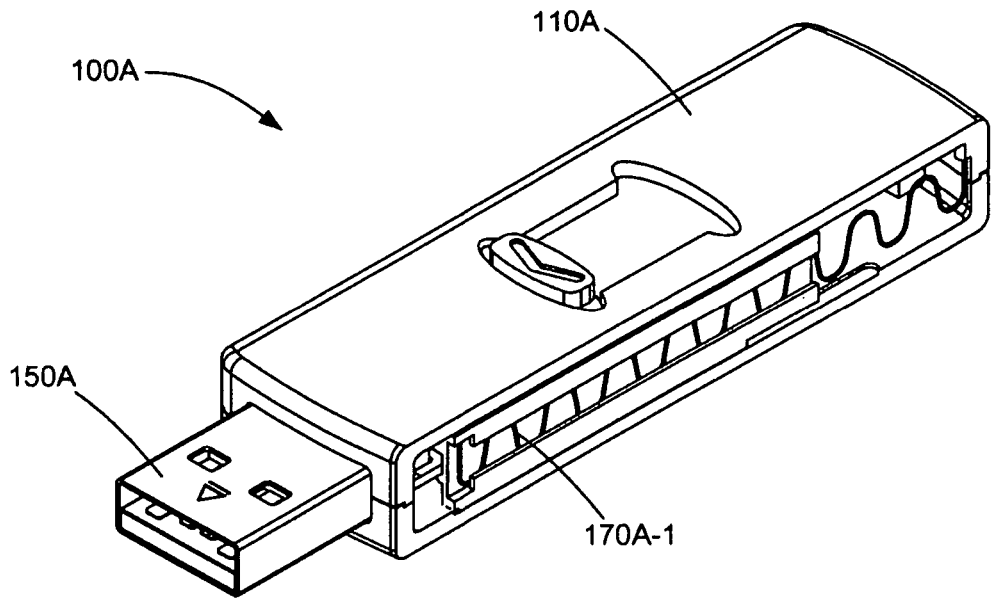
Figures 2, 14:
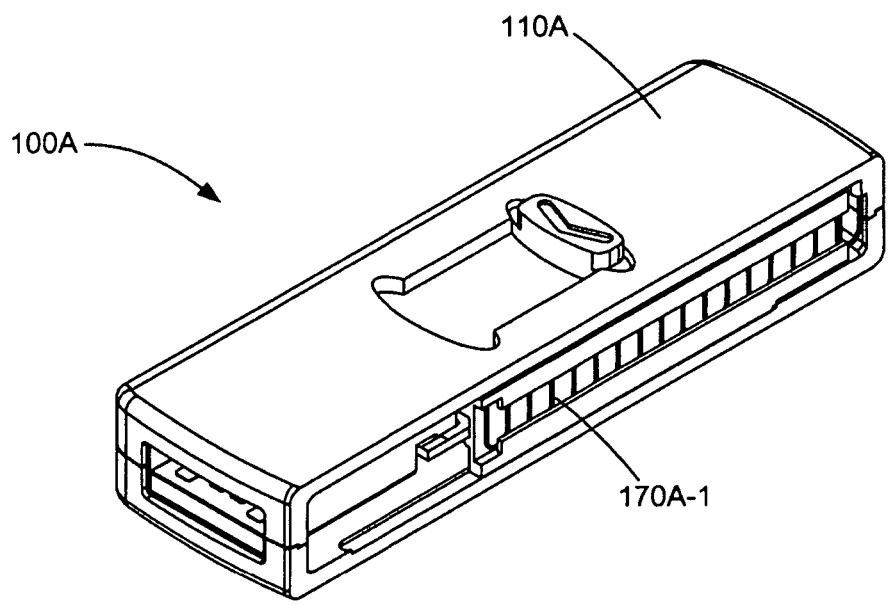
Figure 14A:
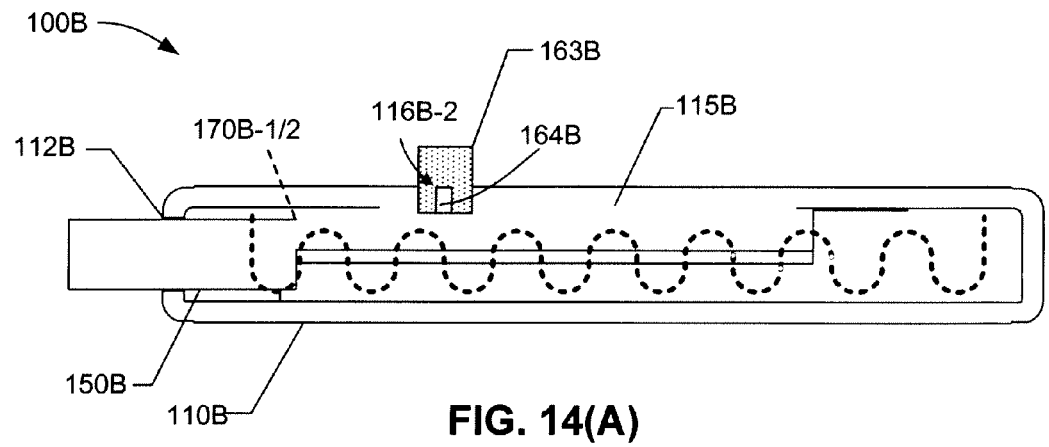
FIGS. 14(A), 14(B) and 14(C) are simplified cross-sectional side views depicting the peripheral device of FIG. 12(A) during operation.
Figure 14B:
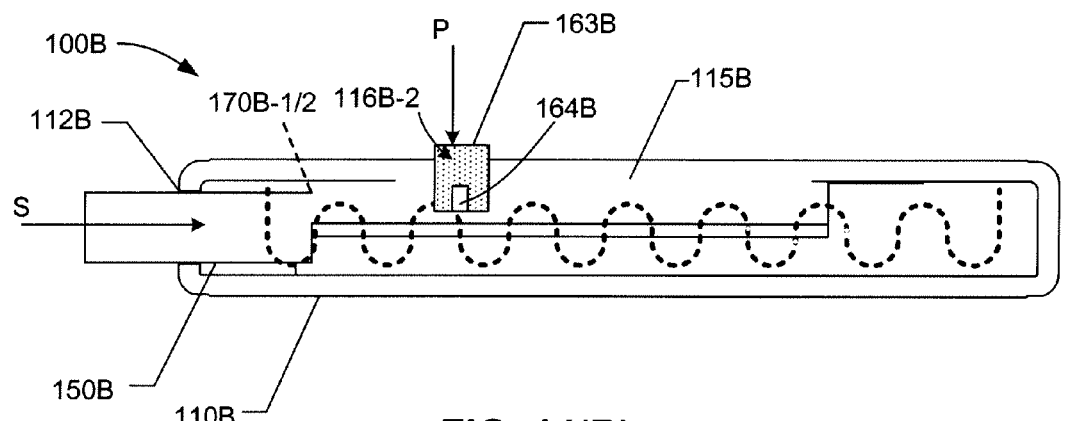
Figure 14C:
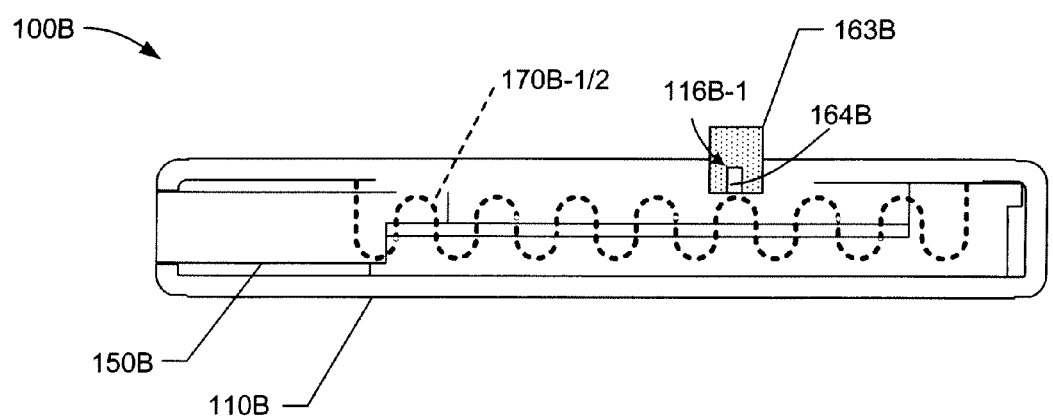

However, instead of connecting the springs to the rear end slide rails 167B-1 and 167B-2 and to the front of housing 110B, the connections are reversed in the present embodiment to facilitate the spring-loaded retraction operation illustrated in FIGS. 14(A) to 14(C).

FIGS. 14-1 and 14-2 are partial perspective views depicting peripheral device 100B in the deployed and retracted positions with side walls of housing 110B removed for illustrative purposes, and FIGS. 14(A) to 14(C) are simplified cross-sectional side views showing peripheral device 100B during a spring-loaded retraction operation. In the deployed state shown in FIGS. 14-1 and 14(A), plug connector 150B is disposed outside housing 110B, lock tabs 164B are engaged in front lock slots 116B-2, and springs 170B-1 and 170B-2 are subjected to stretch/extension. As indicated in FIG. 14(B), pressing down button 163B releases protrusions 164B from front slot locks 116B-2, causing the sliding rack assembly to be propelled backward (i.e., in the opposite direction of arrow S) by linear springs 170B-1 and 170-2. As indicated in FIGS. 14-2 and 14(C), the plug connector 150B is thus pulled into its retracted position by way of the spring-loaded mechanism such that it is disposed inside housing 110B, and is held in the retracted position by locking protrusions 164B engaged in rear lock slots 116B-1. Subsequent return to the deployed position requires pressing button 163B downward and manually sliding the assembly forward into the deployed position.

Figure 15A:
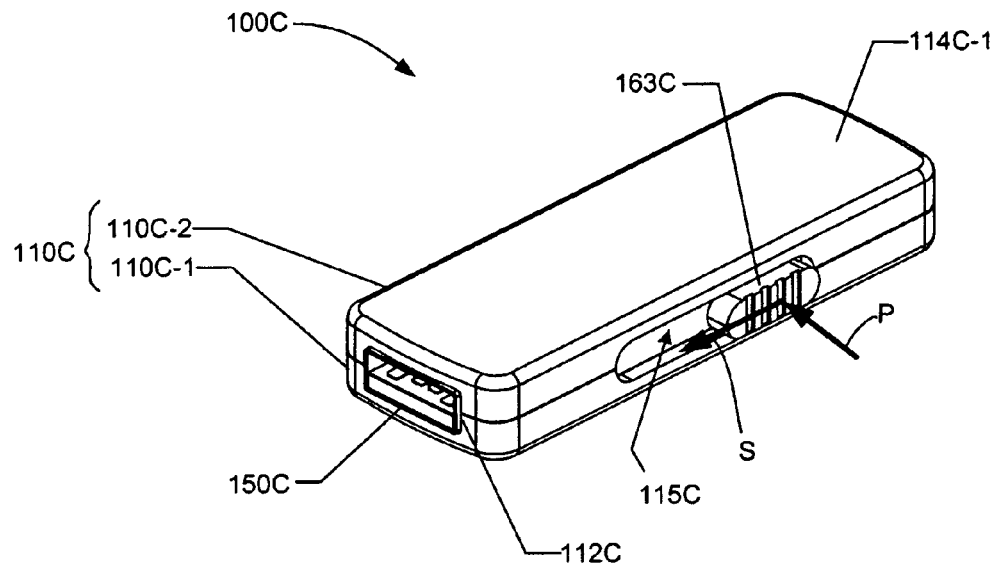
FIGS. 15(A) and 15(B) are perspective views showing a pen-type computer peripheral device in alternative closed and open positions, respectively, according to another embodiment of the present invention.
Figure 15B:
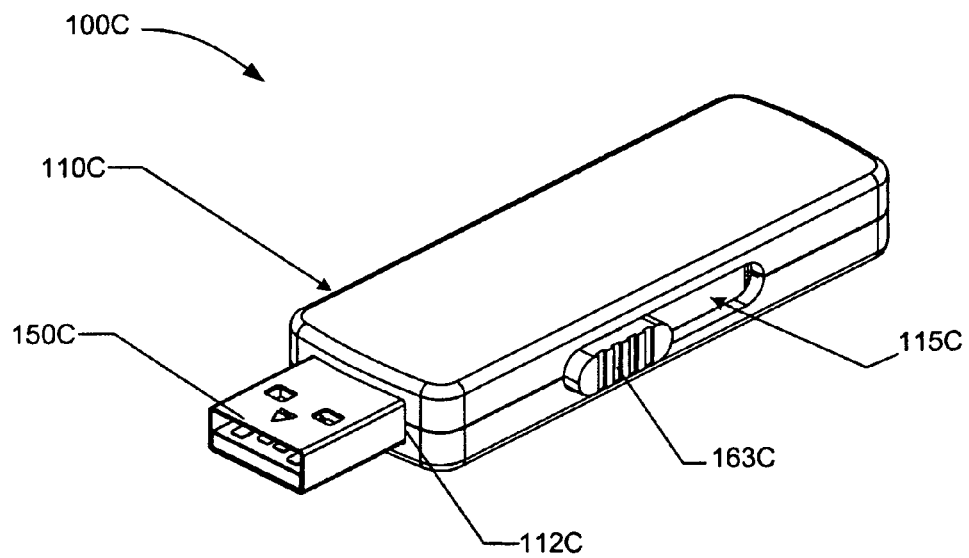

FIGS. 15(A) and 15(B) are perspective top views showing a portable computer peripheral device 100C having a retractable USB plug connector 150C and a side-mounted spring-pressed button 163C according to another specific embodiment of the present invention. Similar to the first embodiment (described above), in a fully retracted position, USB plug connector 150C is retracted through a front opening 112C defined by elongated housing 110C, and press-push button 163C is integrally connected to a positioning member (not shown, described below) and is partially exposed through a slot 115C to facilitate manual movement from the fully retracted (first) position shown in FIG. 15(A), to the fully deployed (second) position shown in FIG. 15(B). In addition, similar to the first specific embodiment described above, a pair of linear springs disposed in housing 110C bias plug connector 150C from the retracted position shown in FIG. 15(A) to the deployed position shown in FIG. 15(B). The retracting operation is performed by pressing press-push button 163C, which is extends through a slot 115C defined in a side wall of housing 110C, and manually pulling button 163C backward along slot 115C (i.e., in the direction opposite to arrow S in FIG. 15(A)) to load the linear springs for a future spring-loaded deployment.

Figure 16:
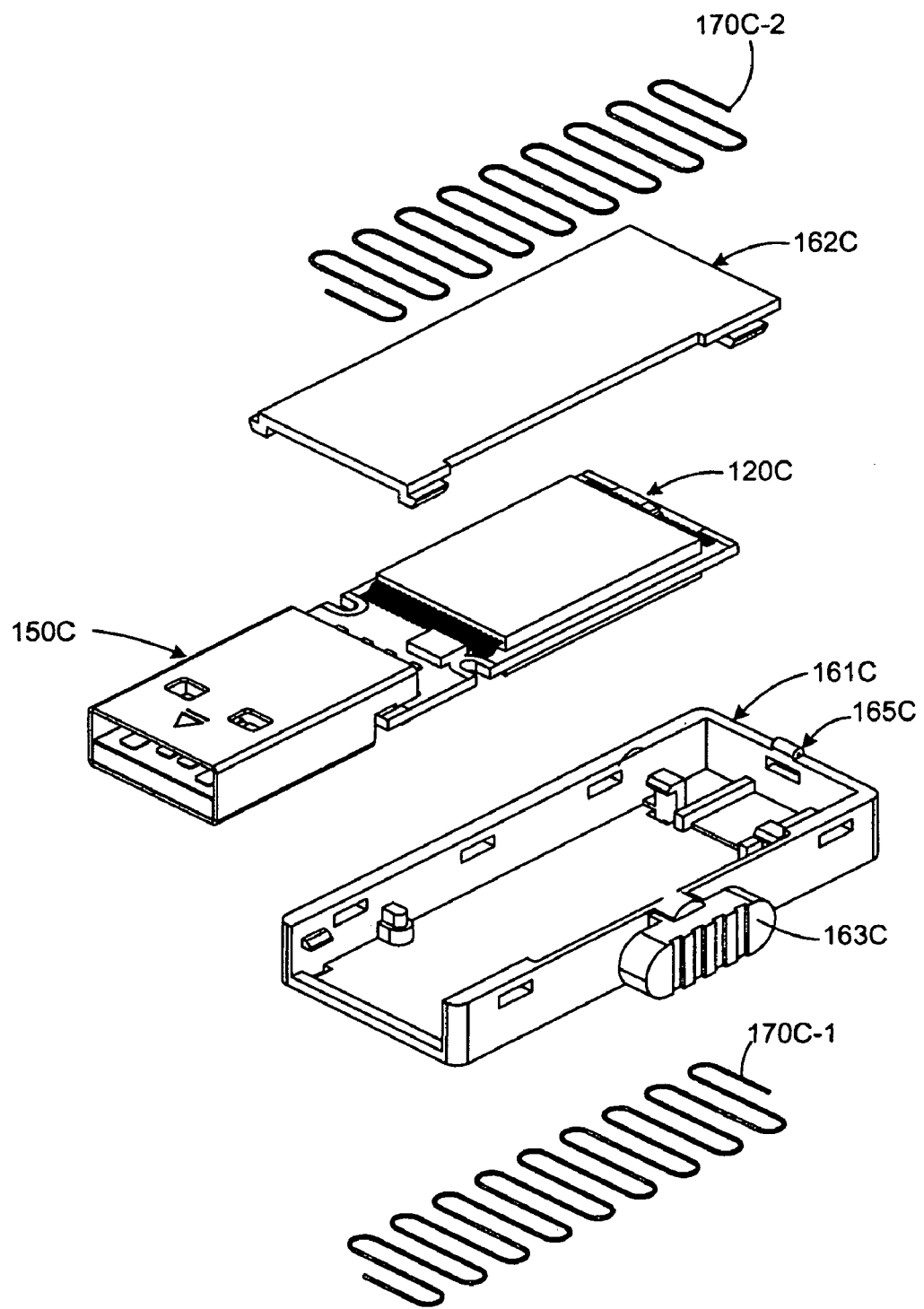
FIG. 16 is an exploded perspective view showing the sliding-rack assembly of the pen-type computer peripheral device of FIG. 15(A) in additional detail.

FIG. 16 is an exploded perspective view showing a spring-loaded sliding rack assembly of device 100C. The assembly includes a PCBA 120C with USB plug connector 150C mounted thereon, a two-part carrier (slide rack) 160C including a body 161C and a cover (upper wall) 162C, and two linear springs 170C-1 and 170C-2. Note that press-push button 163C extends from a side wall of body 161C. PCBA 120C is mounted into body 161C and then secured by cover 162C. The rear ends of springs 170C-1 and 170C-2 are then attached to structures 165C located on the top and bottom sides of body 161C.

Figure 17:
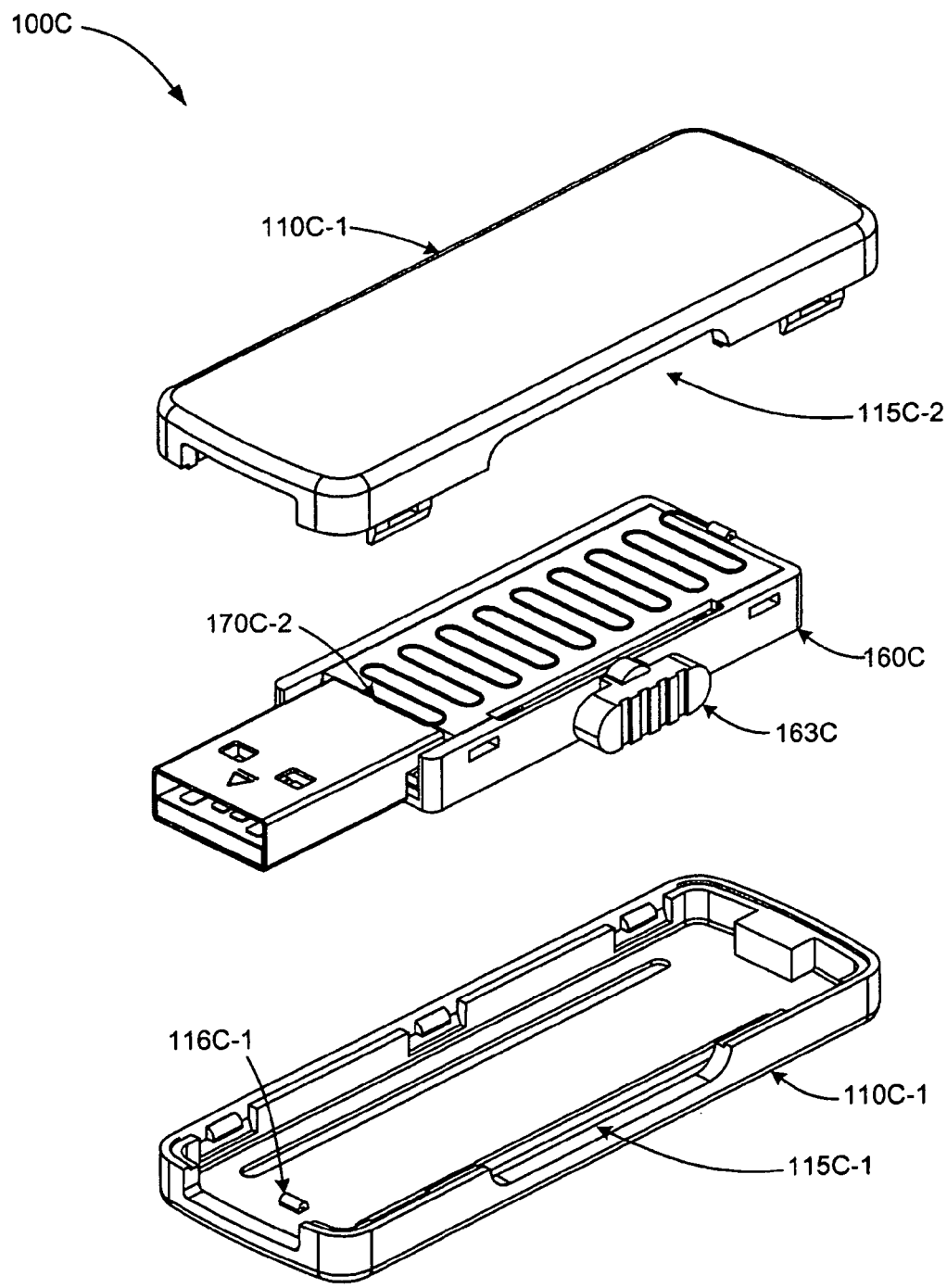
FIG. 17 is an exploded perspective view showing the pen-type computer peripheral device of FIG. 15(A) in additional detail.

As indicated in FIG. 17, assembly 160C is then mounted between lower housing 110C-1 and upper housing 110C-2 such that front ends of the springs (e.g., spring 170C-2) are attached to corresponding structures (e.g., structure 116C-1) disposed on the inside surfaces of the housing portions, and such that press-push button 163C is disposed in a slot formed by slot portions 115C-1 and 115C-2.

Figure 18A:
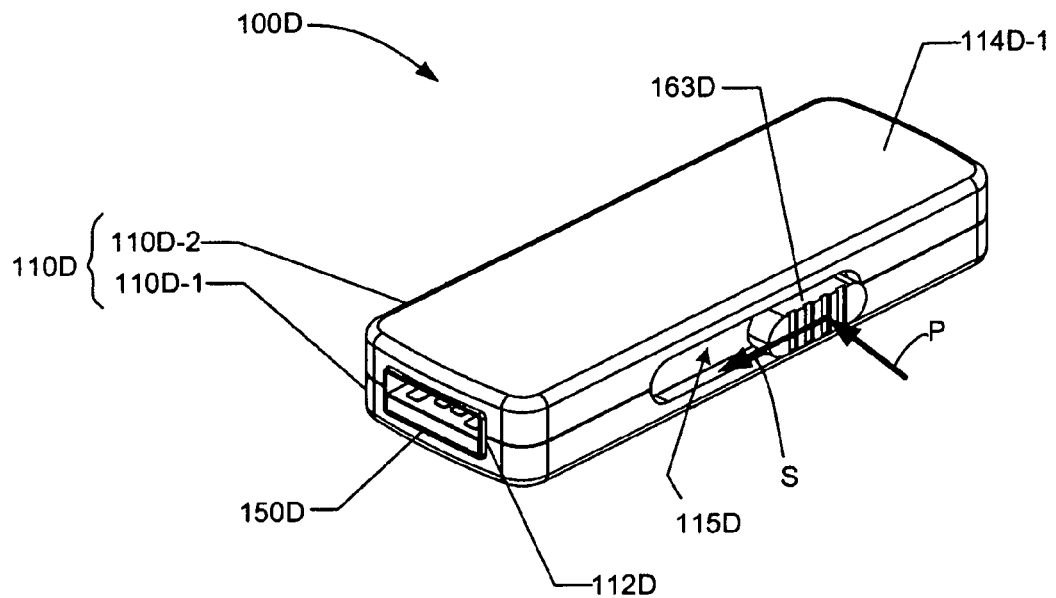
FIGS. 18(A) and 18(B) are perspective views showing a pen-type computer peripheral device in alternative closed and open positions, respectively, according to another embodiment of the present invention.
Figure 18B:
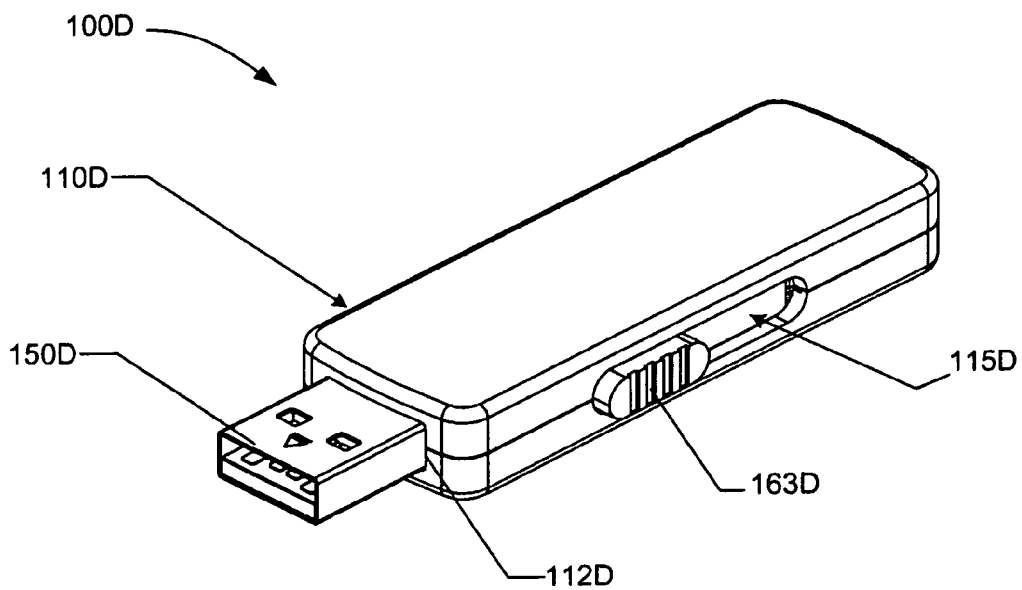

FIGS. 18(A) and 18(B) are perspective top views showing a portable computer peripheral device 100D having a retractable USB plug connector 150D and a side-mounted spring-pressed button 163D according to another specific embodiment of the present invention. Similar to the embodiment described above with reference to FIGS. 15(A) to 17, in a fully retracted position, USB plug connector 150D is retracted through a front opening 112D defined by elongated housing 110D, and press-push button 163D is integrally connected to a positioning member (not shown, described below) and is partially exposed through a slot 115D to facilitate manual movement from the fully retracted (first) position shown in FIG. 18(A), to the fully deployed (second) position shown in FIG. 18(B). However, device 100D includes a pair of linear springs disposed in housing 110D that bias plug connector 150D from the deployed position shown in FIG. 18(B) to the retracted position shown in FIG. 18(A). The deploying operation is performed by pressing press-push button 163D, which extends through a slot 115D defined in a side wall of housing 110D, and manually pushing forward, which causes button 163D to slide along slot 115D (i.e., in the direction of arrow S in FIG. 18(A)) to load the linear springs for a future spring-loaded retraction.

Figure 19:
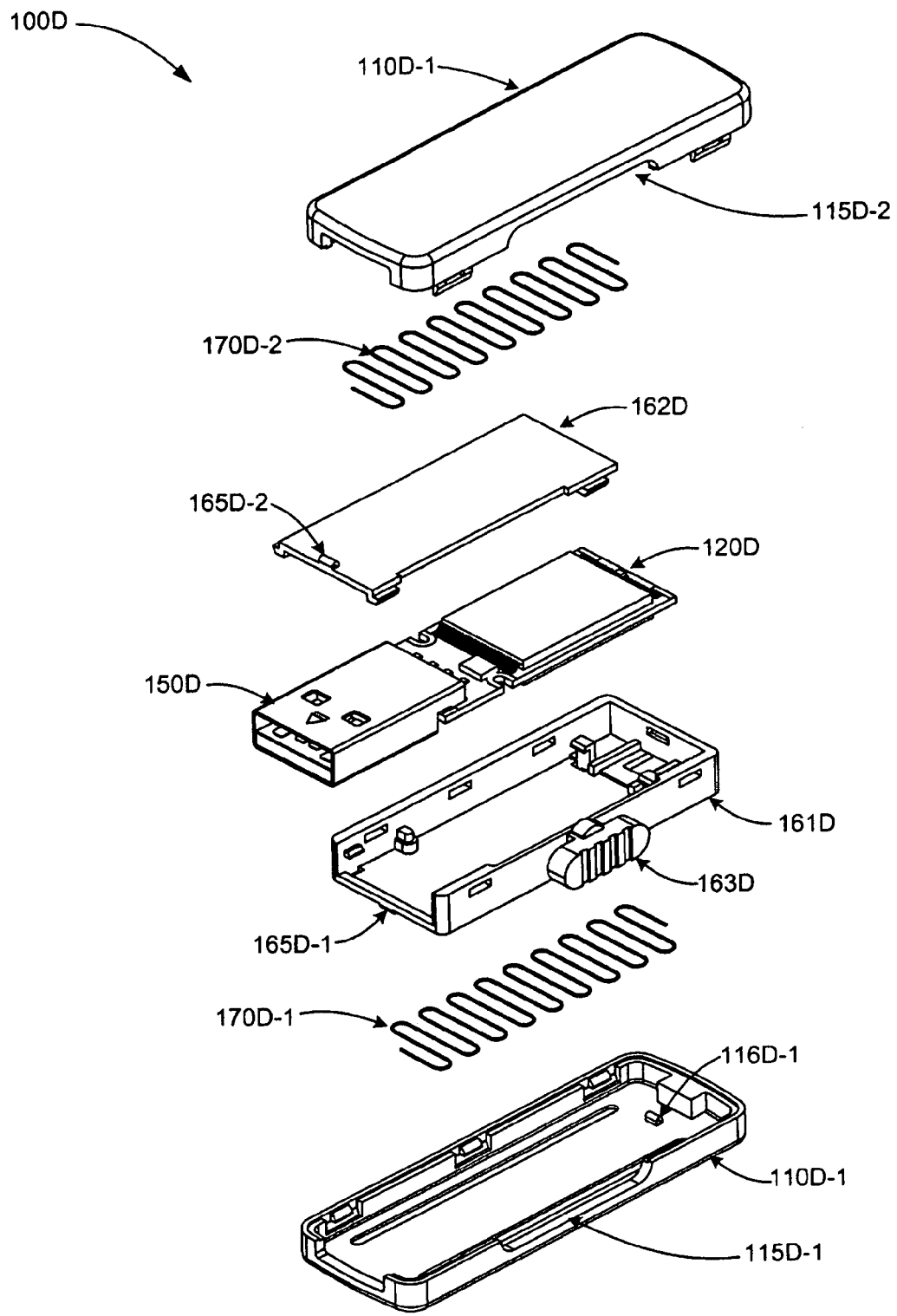
FIG. 19 is an exploded perspective view showing the peripheral device of FIG. 18(A) in additional detail.

FIG. 19 is an exploded perspective view showing device 100D in additional detail. Similar to the previous embodiment, a sliding rack assembly includes a PCBA 120D with USB plug connector 150D mounted thereon, a two-part carrier (slide rack) 160D including a body 161D and a cover (upper wall) 162D, and two linear springs 170D-1 and 170D-2, with press-push button 163D extending from a side wall of body 161D. PCBA 120D is mounted into body 161D and then secured by cover 162D in the manner described above, but the front ends of springs 170D-1 and 170D-2 are then attached to structures 165D-1 and 165D-2 located on cover 162D and the bottom side of body 161D. The assembly is then mounted between lower housing 110D-1 and upper housing 110D-2 such that rear ends of the springs are attached to corresponding structures (e.g., structure 116D-1) disposed on the inside surfaces of the housing portions, and such that press-push button 163D is disposed in a slot formed by slot portions 115D-1 and 115D-2.

Figure 20A:
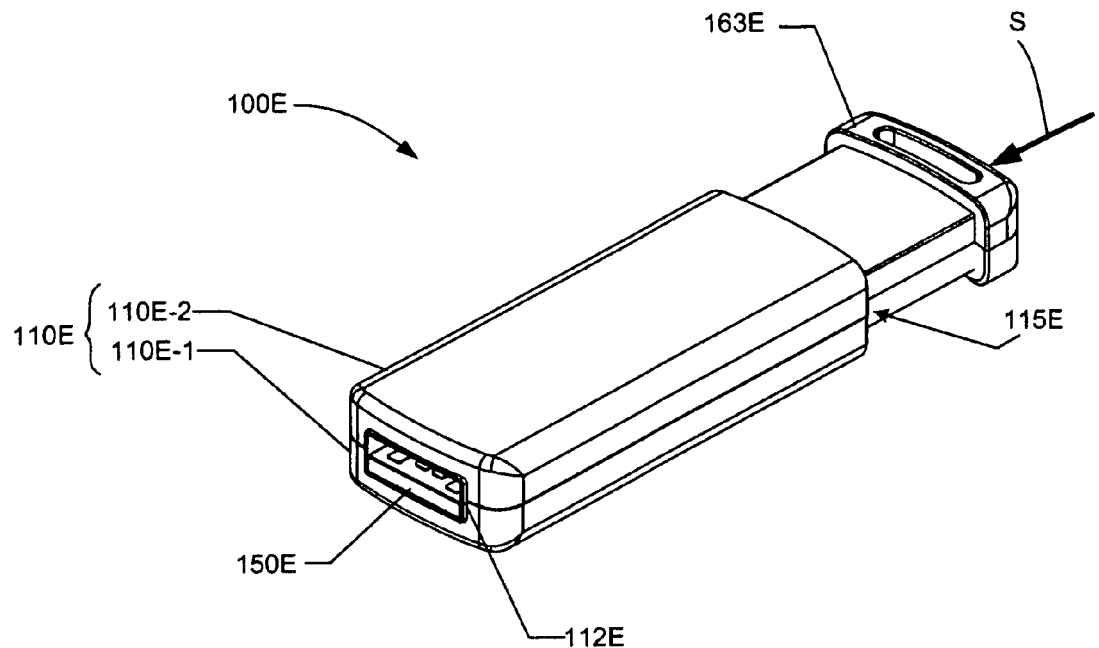
FIGS. 20(A) and 20(B) are perspective views showing a pen-type computer peripheral device in alternative closed and open positions, respectively, according to another embodiment of the present invention.
Figure 20B:
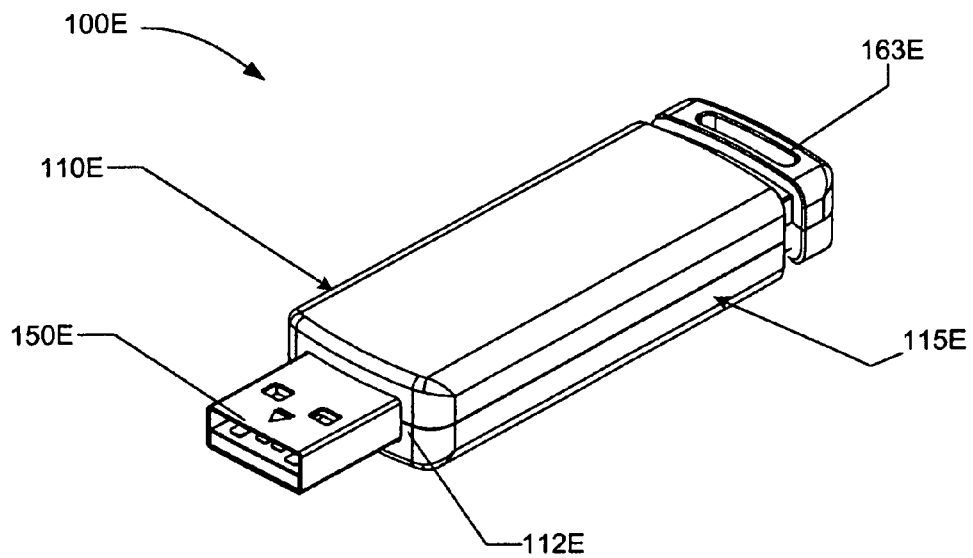

FIGS. 20(A) and 20(B) are perspective top views showing a portable computer peripheral device 100E having a retractable USB plug connector 150E and a rear-mounted spring-pressed button 163E according to another specific embodiment of the present invention. Similar to the embodiments described above, in a fully retracted position, USB plug connector 150E is retracted through a front opening 112E defined by elongated housing 110E, and press-push button 163E is integrally connected to a positioning member (not shown, described below) and is partially exposed through a rear opening 115E to facilitate manual movement from the fully retracted (first) position shown in FIG. 20(A), to the fully deployed (second) position shown in FIG. 20(B). Also, similar to the retracing-type devices described above, device 100E includes at least one linear springs disposed in housing 110E that biases plug connector 150E from the deployed position shown in FIG. 20(B) to the retracted position shown in FIG. 20(A). The deploying operation is performed by pressing press-push button 163E, which extends through a rear opening 115E defined in housing 110E, and manually pushing forward, which causes button 163E to move toward housing 110E (i.e., in the direction of arrow S in FIG. 15(A)) to load the linear spring(s) for a future spring-loaded retraction.

Figure 21:
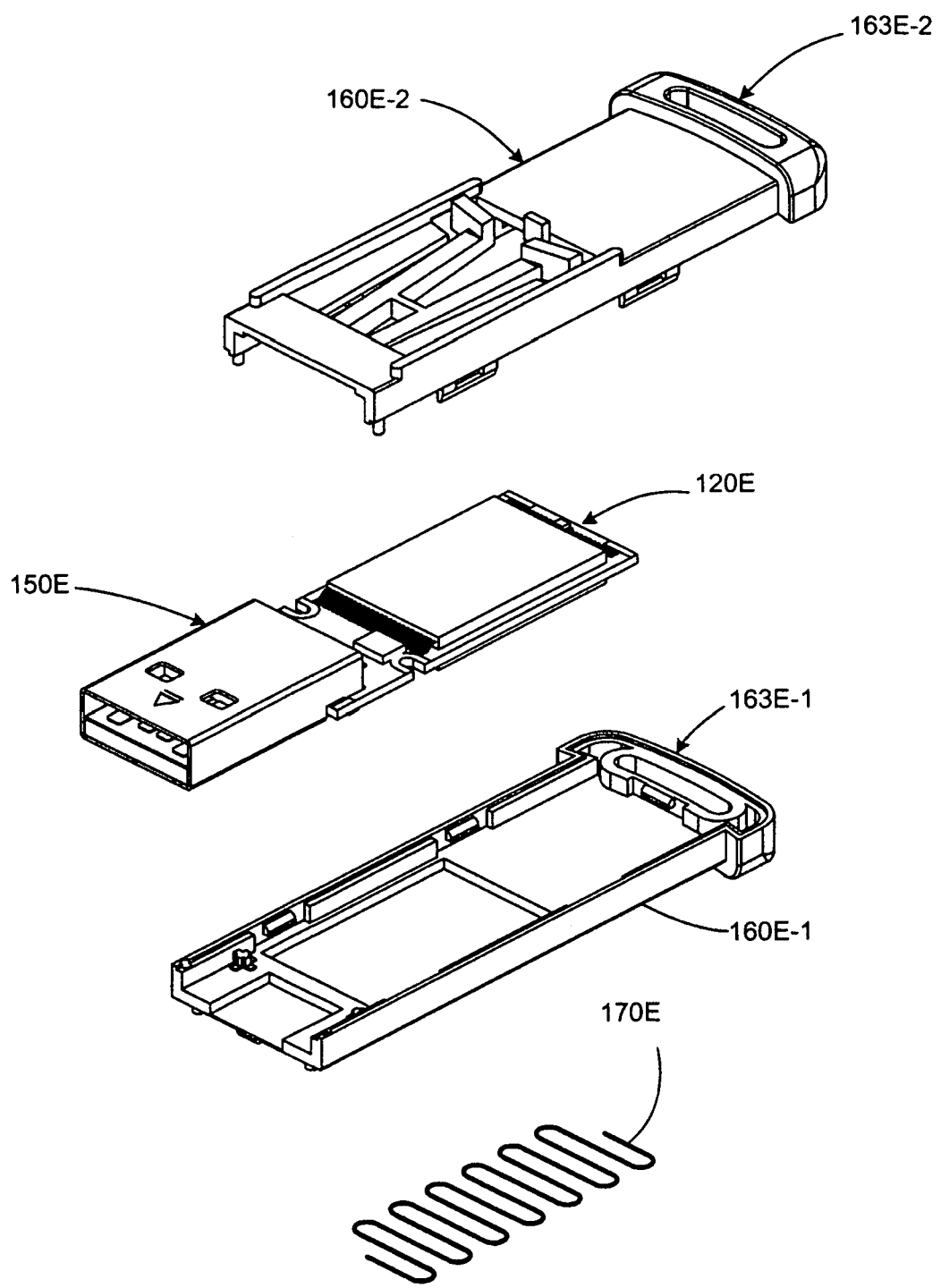
FIG. 21 is an exploded perspective view showing the sliding-rack assembly of the pen-type computer peripheral device of FIG. 20(A) in additional detail.

FIG. 21 is an exploded perspective view showing a spring-loaded sliding rack assembly of device 100E. The assembly includes a PCBA 120E with USB plug connector 150E mounted thereon, one linear springs 170E, and a two-part carrier (slide rack) including a lower carrier portion 160E-1 and an upper carrier portion 160E-2, which respectively include lower button portion 163E-1 and upper button portion 163E-2. PCBA 120C is mounted between lower carrier portion 160E-1 and upper carrier portion 160E-2, which are then snap-coupled in a manner similar to that used to connect housing portions in previously described embodiments. The front end of spring 170E is then attached to a structure similar to that described above that is disposed on the lower side (not shown) of lower carrier portion 160E-1.

Figure 22:
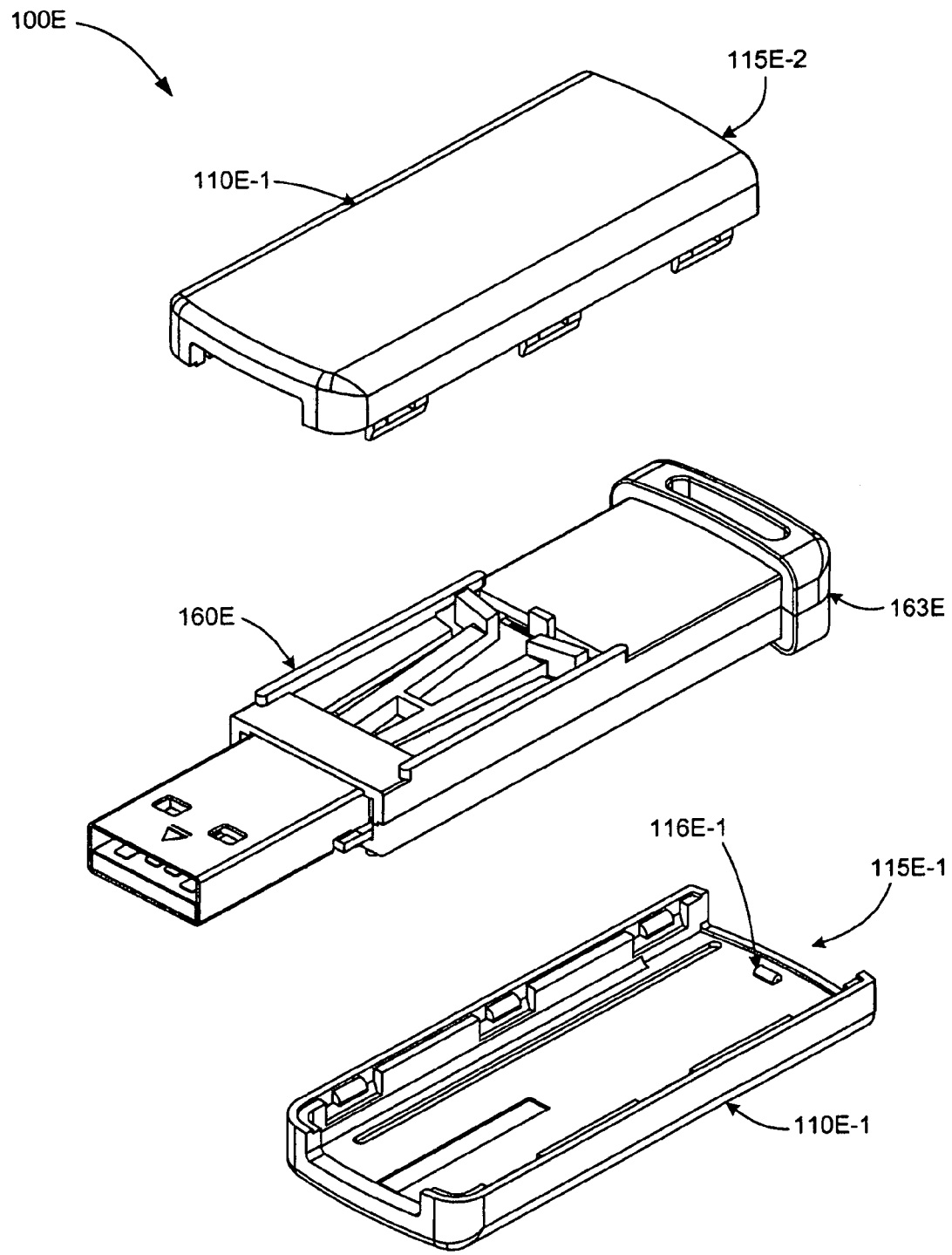
FIG. 22 is an exploded perspective view showing the pen-type computer peripheral device of FIG. 20(A) in additional detail.

As indicated in FIG. 22, assembly 160E is then mounted between lower housing 110E-1 and upper housing 110E-2 such that rear end of the spring (not shown, disposed on the lower side of assembly 160E) is attached to structure 116E-1 disposed on the inside surfaces of lower housing portion 110E-1, and such that press-push button 163E is disposed in an opening formed by rear opening portions 115E-1 and 115E-2.

Figure 23A:
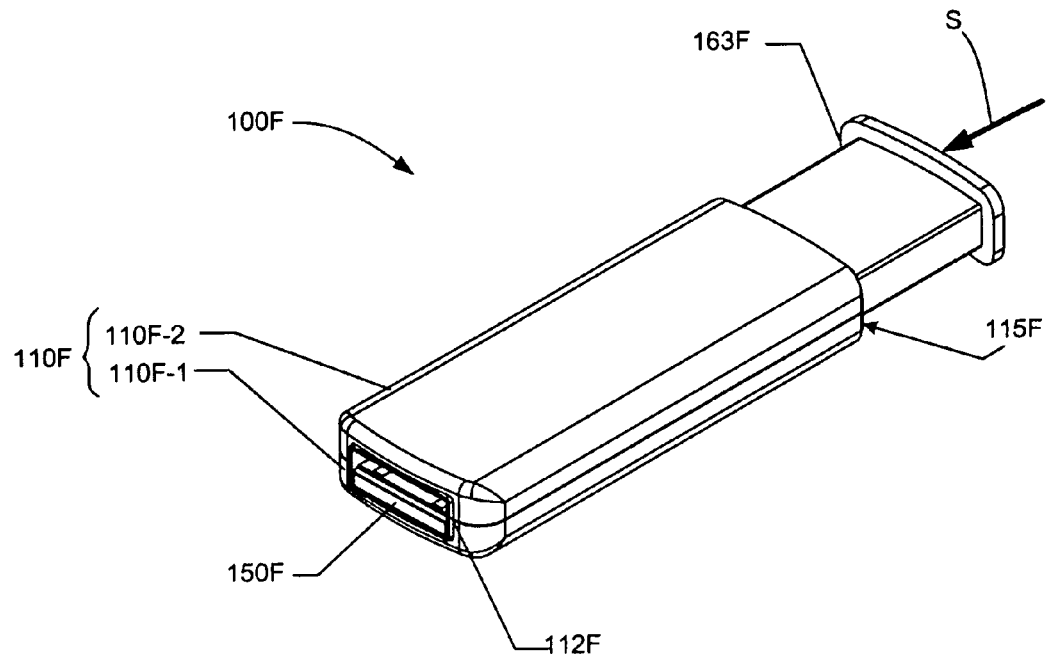
FIGS. 23(A) and 23(B) are perspective views showing a pen-type computer peripheral device in alternative closed and open positions, respectively, according to another embodiment of the present invention.
Figure 23B:
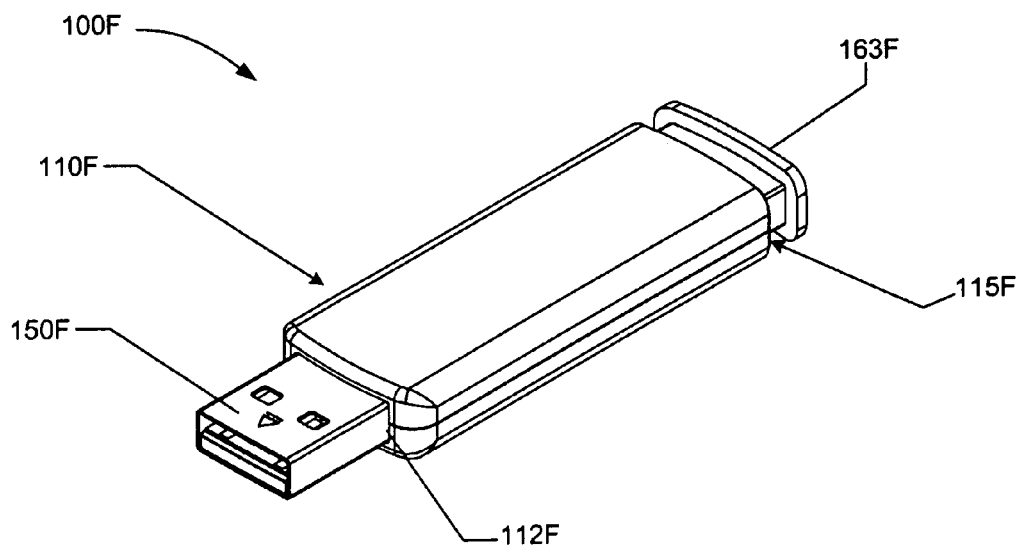

FIGS. 23(A) and 23(B) are perspective top views showing a portable computer peripheral device 100F having a retractable USB plug connector 150F and a rear-mounted spring-pressed button 163F according to another specific embodiment of the present invention. Similar to the embodiments described above, a deploying operation is performed by pressing press-push button 163F, which extends through a rear opening 115F defined in housing 110F, and manually pushing forward, which causes button 163F to move toward housing 110F (i.e., in the direction of arrow S in FIG. 15(A)) to load the linear spring(s) for a future spring-loaded retraction.

Figure 24A:
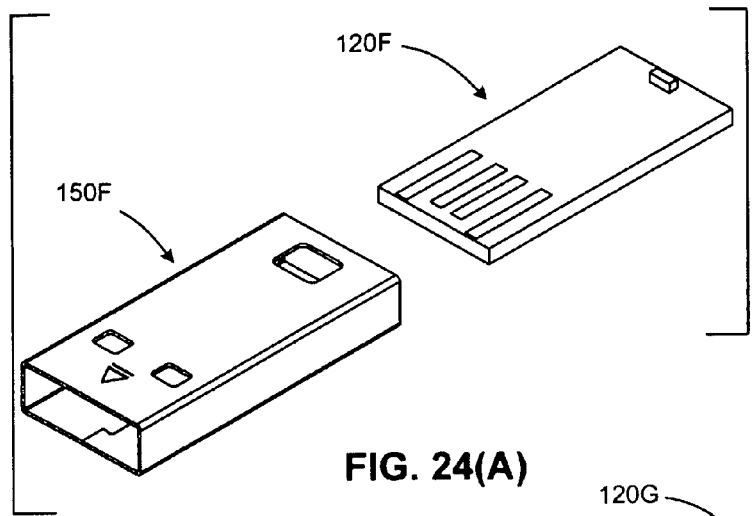
FIGS. 24(A), 24(B) and 24(C) are exploded perspective views showing alternative PCBA and USB plug connector arrangements according to alternative embodiments of the invention.
Figure 24B:
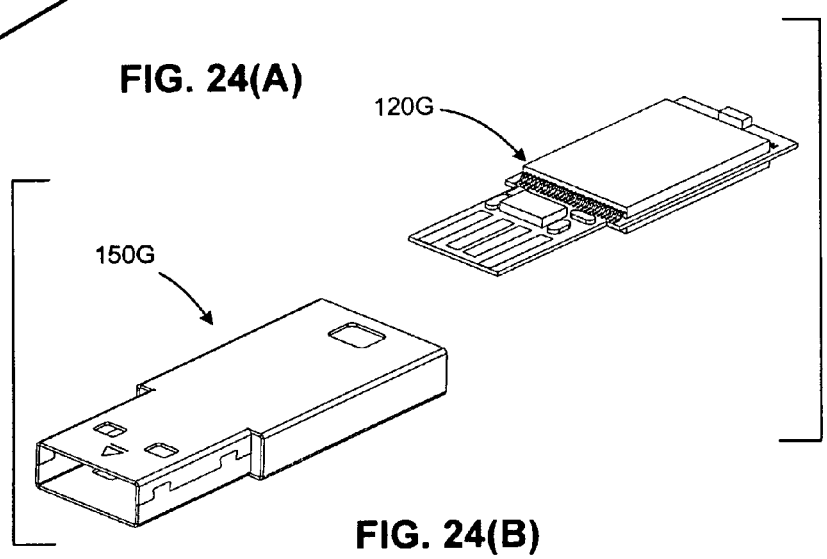
Figure 24C:
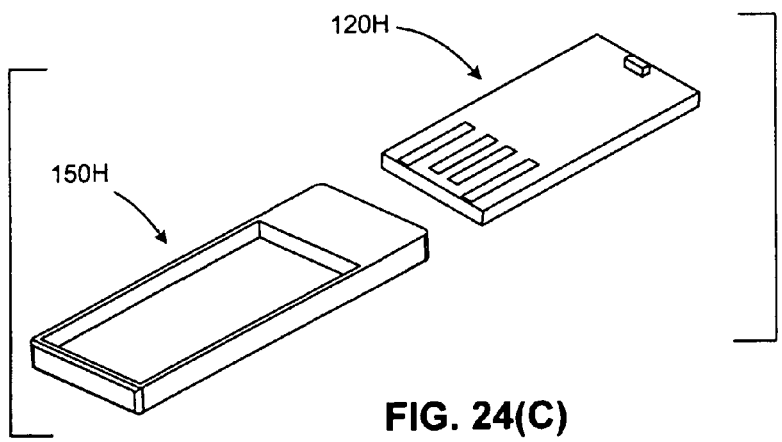

FIGS. 24(A) to 24(C) are exploded perspective views showing alternatives PCBA 120F to 120H and alternative USB plug connectors 150F to 150H according to alternative embodiments of the invention. As described previously, a sliding rack assembly includes a PCBA (e.g., 120A; see FIG. 9), a USB plug connector (e.g., connector 150A; see FIG. 9), a slide rack (e.g., positioning member 160A; see FIG. 9), and two linear springs (e.g., springs 170A-1 and 170A-2; see FIG. 9). Similar arrangements are described above with reference to the various additional embodiments. In accordance with additional alternative embodiments of the present invention, PCBAs 120A-E and USB plug connectors 150A-E of these various embodiments can be replaced by alternative PCBAs 120F to 120H and connectors 150F to 150H shown in FIGS. 24(A) to 24(C). In particular, FIG. 24(A) shows a Chip-On-Board (COB) PCBA 120F and a standard metal USB plug 150F, wherein COB PCBA 120F includes the memory, I/O and processor circuits described above that are mounted in chip (i.e., unpackaged) form onto a printed circuit board substrate, and then overmolded with a suitable plastic material. Similarly, FIG. 24(B) shows a Slim Printed Circuit Board Assembly (Slim PCBA) 120G and a modified metal USB plug shell 150G, and FIG. 24(C) shows a Chip-On-Board (COB) PCBA 120H and a COB carrier 150H.

An alternative method for joining top and bottom housings in the above-described embodiments include ultrasonic welding using known techniques. The materials of the top and bottom housing to use in this process may be made of thermoplastic materials such as Acrylonitrile Butadiene Styrene (ABS), ABS/polycarbonate alloy, polyester, Polyvinyl chloride (PVC), Nylon and Nylon with fiberglass. Ultrasonic bonders are applied, e.g., on the flat edges of the side walls of the bottom housing to serve as the initial melting point as an ultrasonic wave from welding machine generates high frequency vibration between the ultrasonic bonder and the top housing.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a USB connector has been shown and described, other types of connectors such as a Secure Digital (SD) interface circuit, a Micro SD interface circuit, a Multi Media Card (MMC) interface circuit, a Compact Flash (CF) interface circuit, a Memory Stick (MS) interface circuit, a PCI-Express interface circuit, an Integrated Drive Electronics (IDE) interface circuit, a Serial Advanced technology Attachment (SATA) interface circuit, an external SATA interface circuit, a Radio Frequency Identification (RFID) interface circuit, a fiber channel interface circuit, and an optical connection interface circuit may be used to achieve the same function. Additionally, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

The invention claimed is:

1. A portable computer peripheral apparatus comprising:
an elongated housing defining a first opening and a front end portion defining a second opening;
at least one electronic device mounted inside of the housing;
a plug connector movably connected to the housing and electronically connected to said at least one electronic device; and
a spring-loaded mechanism including: a positioning member including: a base portion, a flexible wall connected to the base portion such that the flexible wall is resiliently bendable relative to the base portion, first and second side walls fixedly connected to the base portion, and an actuating button disposed on the flexible wall and protruding through the first opening for manually moving the plug connector between a first position, in which the plug connector is positioned inside of the housing, and a second position in which the plug connector extends through the end opening such that both the plug connector is exposed outside of the housing, and wherein the spring loaded mechanism includes a resilient member for biasing the plug connector between the first position and the second position, the resilient member including first and second linear springs disposed on opposing sides of the positioning member such that the first and second springs are parallel to and in contact with the first and second side walls, respectively.

2. The portable computer peripheral apparatus according to claim 1, wherein the resilient member includes a first end connected to a front portion of the housing, and a second end coupled to the plug connector, whereby the resilient member biases the plug connector from the first position to the second position.

3. The portable computer peripheral apparatus according to claim 1, wherein the resilient member includes a first end connected to a rear portion of the housing, and a second end coupled to the plug connector, whereby the resilient member biases the plug connector from the second position to the first position.

4. The portable computer peripheral apparatus according to claim 1, wherein the spring-loaded mechanism comprises an assembly including said a positioning member and a printed circuit board assembly (PCBA), where the plug connector is fixed connected to a front end of the PCBA, the at least one electronic device is mounted on the PCBA, and the actuating button is integrally formed on or attached to the sliding rack.

5. The portable computer peripheral apparatus according to claim 4, wherein the positioning member further comprises first and second elongated side grooves extending along said first and second side walls, respectively, and wherein the first and second linear springs disposed in the first and second side grooves, respectively.

6. The apparatus of claim 1, wherein the positioning member further comprises: a flexible wall connected to the base portion such that the flexible wall is resiliently bendable relative to the base portion, wherein the actuating button comprises a press-push button disposed on the flexible wall such that when the press-push button is pressed into the housing, the first and second slide rails press against a first inside surface of the housing such that the flexible wall bends into the housing.

7. The apparatus of claim 6, wherein the positioning member further comprises a first locking structure disposed on the flexible wall, wherein the housing further comprises a second locking structure and a third locking structure, and wherein the positioning member is mounted in the housing such that the first locking structure engages the second locking structure when the plug connector is in the first position, and such that the first locking structure engages the third locking structure when the plug connector is in the second position.

8. The apparatus of claim 6, wherein the housing comprises a top wall and an opposing bottom wall having a first width, and opposing side walls having a second width and forming a rectangular cross section with said top and bottom walls, and wherein the press-push button protrudes through a slot defined in said top wall.

9. The apparatus of claim 6, wherein the housing comprises a top wall and an opposing bottom wall having a first width, and opposing side walls having a second width and forming a rectangular cross section with said top and bottom walls, and wherein the press-push button protrudes through a slot defined in one of said side walls.

10. The apparatus of claim 6, wherein the housing comprises a top wall, an opposing bottom wall, and opposing side walls forming a rectangular cross-section, and wherein the press-push button protrudes through a rear opening disposed opposite to said front end opening.

11. The apparatus of claim 1, wherein said at least one electronic device disposed in a Chip-On-Board (COB) package.

12. The apparatus of claim 1, wherein said at least one electronic device disposed in a Slim Printed Circuit Board Assembly (Slim PCBA) package.

13. The apparatus of claim 1, wherein the plug connector comprises a Universal Serial Bus (USB) plug.

* * * * *